US006979992B2

(12) United States Patent
Craven

(10) Patent No.: US 6,979,992 B2
(45) Date of Patent: Dec. 27, 2005

(54) PORTABLE RADIATED EMISSIONS MEASUREMENT SYSTEM

(75) Inventor: Kim L. Craven, Mooresville, NC (US)

(73) Assignee: Duke Energy Corporation, Charlotte, NC (US)

( * ) Notice: Subject to any disclaimer, the term of this patent is extended or adjusted under 35 U.S.C. 154(b) by 0 days.

(21) Appl. No.: 10/147,726

(22) Filed: May 16, 2002

(65) Prior Publication Data

US 2002/0190725 A1    Dec. 19, 2002

Related U.S. Application Data

(60) Provisional application No. 60/291,307, filed on May 16, 2001.

(51) Int. Cl.[7] ............................................ G01R 23/00
(52) U.S. Cl. .................................................. 324/76.19
(58) Field of Search .............................. 324/76.19, 627

(56) References Cited

U.S. PATENT DOCUMENTS

| | | | | |
|---|---|---|---|---|
| 3,641,515 A | * | 2/1972 | Sues ....................... | 324/76.26 |
| 3,750,017 A | | 7/1973 | Bowman et al. ............... | 324/72 |
| 4,277,744 A | | 7/1981 | Audone et al. ................ | 324/72 |
| 4,570,117 A | | 2/1986 | Holt ............................ | 324/72 |
| 4,611,166 A | | 9/1986 | Aslan .......................... | 324/95 |
| 4,859,933 A | * | 8/1989 | Taylor et al. ............. | 324/76.19 |
| 5,065,334 A | * | 11/1991 | Taylor et al. ................. | 702/76 |
| 5,294,937 A | | 3/1994 | Ostteen et al. .............. | 342/459 |
| 5,555,207 A | | 9/1996 | Barker ................... | 324/121 R |
| 5,818,389 A | | 10/1998 | Lazar ......................... | 342/383 |
| 6,072,418 A | | 6/2000 | Celton et al. ................. | 342/13 |
| 6,144,341 A | | 11/2000 | Kraz .......................... | 343/703 |
| 6,509,742 B1 | * | 1/2003 | Ebizuka et al. ............. | 324/627 |

* cited by examiner

Primary Examiner—Vincent Q. Nguyen
Assistant Examiner—Timothy J. Dole
(74) Attorney, Agent, or Firm—Kennedy Covington Lobdell & Hickman, LLP

(57) ABSTRACT

Methods and systems are disclosed for analyzing interference caused by electromagnetic and other radiated emissions. A system includes an antenna, a spectrum analyzer, a computer and associated software. Configurations are defined for frequency ranges and tests are defined to include one or more configurations. After stationing the system in a desired location, a test may be selected for execution. Because a test may include multiple configurations, each representing a different frequency range or other parameters, multiple frequency ranges may be scanned by the spectrum analyzer without further intervention by a user. A data set is created for each configuration in each test that is executed.

43 Claims, 15 Drawing Sheets

PORTABLE RADIATED EMISSIONS MEASUREMENT SYSTEM

CROSS-REFERENCE TO RELATED APPLICATION

This application is entitled to the benefit of, and claims priority to, U.S. Provisional Patent Application Ser. No. 60/291,307, filed May 16, 2001, entitled "PORTABLE RADIATED EMISSIONS MEASUREMENT APPARATUS."

BACKGROUND OF THE PRESENT INVENTION

1. Field of the Present Invention

The present invention relates generally to the field of analyzing radiated emissions, and, in particular, to the art of more efficiently detecting, measuring, storing and analyzing large volumes of electromagnetic interference data in a wide range or commercial, industrial and other sites and facilities.

2. Background Art

Electromagnetic interference (EMI) has become a major problem today in commercial and industrial environments due to the changing magnitude and frequencies of electromagnetic emissions of electronic equipment such as cellular and portable telephones, hand-held walkie-talkies, radio and television broadcast equipment, and new commercial and industrial specific equipment, most if not all of which generate electromagnetic fields. Because of the wide range of operating characteristics of these devices and the widespread use of such equipment, it is extremely difficult for engineers to determine which of the devices may pose the greatest threat to the electromagnetic environment and which industries are most impacted. All commercial and industrial users of electronic equipment that may radiate electromagnetic emissions have the desire to measure EMI levels within their facilities.

For example, one industry that is potentially impacted by such equipment, as well as by modern electronic healthcare equipment, is the healthcare industry, wherein healthcare facilities are constantly installing new types of end-use electronic equipment in order to improve patient care and reduce operating cost. The continual introduction of new and sophisticated biomedical, diagnostic, and therapeutic devices into the healthcare environment increases the background level of electromagnetic energy in healthcare facilities, and may, in some conditions, jeopardize the very medical procedures that these devices were intended to facilitate. The installation of new equipment may render the environment incompatible with sensitive electronic medical equipment such as electrocardiographs (ECGs), electromyographs (EMGs), electroencephalographs (EEGs), and pacemaker programmers posing a threat to what were once safe electromagnetic environments.

Daily changing conditions at these various commercial and industrial facilities decrease the probability of such facilities being able to determine EMI sources. Such conditions may include the frequency of use of a disturbance-generating piece of equipment, the proximity of an EMI source to a susceptible piece of equipment, or the presence of a disturbance-generating piece of equipment on the same circuit used to power a piece of equipment that is susceptible to emissions.

Due to the prevalence of EMI today in a wide variety of commercial and industrial facilities whose operations depend upon the optimal performance of their equipment, it is extremely important for these facilities to be able to measure and document existing background radiated emissions levels, identify characteristics and location of interference sources, determine the strategic locations for sensitive electronic medical equipment, ensure safe electromagnetic environments, and rank the end-use equipment generating radiated emissions. Having the capability to perform such electromagnetic measurements and analysis allows these facilities to more effectively and strategically position and arrange their particularly EMI sensitive equipment to reduce the probability of an equipment malfunction caused by EMI.

The traditional method for solving electromagnetic emissions problems at a particular site is to measure the magnitude and frequency of the electromagnetic fields in the environment at the site using a basic spectrum analyzer, one or more antenna, attenuator pads, and peripheral data printing and storage devices, all of which can be quite expensive. Using the traditional method, a technically skilled EMI investigator is required to program the spectrum analyzer, to make the desired electromagnetic measurements and to analyze the resulting saved data since the spectrum analyzer is difficult to program and operate. The EMI investigator manually programs the analyzer to collect data such as date, time, and period of measurement with minimum, maximum (peak), and average field strengths within the frequency bands of interests. Unfortunately, the investigator cannot create a test plan that can be carried out automatically without the presence of the investigator at the site and without personal interaction with an analyzer.

Because spectrum analyzers are not generally designed to automatically change scanning parameters over a specific time period, the investigator must monitor the equipment at the site throughout the process to continually reset the parameters of the equipment, capture the data, and manage the data during the characterization process. Critical emissions data may be missed due to the manual reconfiguring of the spectrum analyzer. In many cases, not enough data is collected at the site to determine the few clues and facts necessary to assess the source of an EMI problem, the path of the emissions, and viable options to solve the problem. In other cases, the wrong type of data may be collected (e.g. average values instead of maximum values) during the investigation. Frequently, additional visits to the site are required to capture more data or to change measurement parameters on an analyzer. Thus, the traditional method for collecting electromagnetic emissions data is very cumbersome for the investigator.

Moreover, if the investigator does not use analyzers on a regular basis, the investigator can spend a significant amount of time trying to set up the equipment, and very little time performing the measurements, analyzing the data, and focusing on the source of the EMI problem. This problem is exacerbated when an investigation requires data to be gathered and analyzed in multiple locations at a facility. Due to the complexity of this manual process, the time that it takes to perform an electromagnetic investigation may range from a few days to several weeks depending upon the nature of the EMI source, the type and size of the facility, the type and number of end-use devices experiencing EMI problems, and the purpose of the investigation. These timeframes are disadvantageous or unacceptable for many facilities.

Thus, a need exists for an apparatus that will automatically detect and analyze electromagnetic levels with minimal intervention from an EMI investigator. Moreover, a need exists for an apparatus that is portable, user-friendly, low cost, and capable of being programmed off-site in order to prevent the interruption of the services provided at the site, whether commercial or industrial, while at the same time minimizing the cost of taking EMI measurements.

SUMMARY OF THE PRESENT INVENTION

Briefly summarized, the present invention relates to methods and apparatuses for analyzing radiated emissions, such as interference caused by the presence of electromagnetic energy at various frequencies. Broadly defined, a method of analyzing electromagnetic interference in a building according to one aspect of the present invention includes the steps of: defining a plurality of configurations, each configuration corresponding to a plurality of frequencies in a frequency range; stationing a spectrum analyzer in a location in the building; instructing the spectrum analyzer to scan the frequencies in each configuration; and leaving the spectrum analyzer unattended while it scans the frequencies in each configuration.

In features of this method, the step of defining a plurality of configurations occurs before the step of stationing the spectrum analyzer in the building; the step of defining configurations includes defining parameters in addition to the frequencies in the respective frequency ranges and the step of instructing the spectrum analyzer to scan the frequencies in each configuration includes instructing the spectrum analyzer to scan according to the defined parameters; the parameters include an amplitude reference level; the parameters include a resolution bandwidth; the parameters include a sweep time; the parameters include a scan duration; the method further includes selecting, from the plurality of configurations, a subset of configurations for scanning by the spectrum analyzer, and instructing the spectrum analyzer includes instructing the spectrum analyzer to scan only the selected configurations; the step of selecting is carried out before stationing step; selecting is carried out after stationing step; defining a plurality of configurations includes defining configurations having overlapping frequency ranges; leaving the spectrum analyzer unattended includes departing the building; defining a plurality of configurations is carried out using a computer, and instructing the spectrum analyzer is executed by the computer; and defining a plurality of configurations includes using the spectrum analyzer to input parameters for at least one configuration and importing the configuration parameters to the computer from the spectrum analyzer.

In another aspect of the present invention, a method of analyzing electromagnetic interference in a building includes the steps of: storing a plurality of configurations, each configuration corresponding to a plurality of frequencies in a frequency range; accepting, from a user, input representing a command to scan the frequencies in each configuration; and as a result of receiving the command input, scanning the frequencies in each configuration without further intervention from the user.

In features of this aspect, the method further includes accepting, from a user, input identifying a subset of the stored configurations, accepting input representing a command to scan includes accepting input representing a command to scan the frequencies in each configuration in the subset, and scanning the frequencies includes scanning only the frequencies in the configurations in the subset; accepting input identifying a subset occurs before the step of accepting input representing a command to scan; scanning the frequencies includes repeatedly sequencing through the respective configurations such that the frequencies in each configuration are scanned a predetermined number of times before the frequencies in the next sequential configuration are scanned; the predetermined number is one; the method further includes storing data corresponding to each frequency scanned; storing data includes storing a separate data set for each configuration; and the frequencies are scanned for a predetermined period of time.

In another aspect of the present invention, a method of analyzing the electromagnetic interference includes the steps of: defining a plurality of configurations, each configuration corresponding to a plurality of frequencies in a frequency range; defining a plurality of tests, each test including at least one of the defined configurations; selecting one of the defined tests for execution; and scanning the frequencies in each configuration in the specified test.

In features of this aspect, the method further includes specifying parameters for the execution of the selected test, with the selected test and parameters together defining a test run; the test run is one of a plurality of test runs; more than one test run specifies the same test; specifying a test includes selecting a test from a plurality of pre-defined tests; at least one of the configurations is defined at a first location, and wherein the step of scanning occurs at a second location; and at least one of the tests is defined at a first location, and scanning occurs at a second location.

In yet another aspect of the present invention, a portable system for analyzing electromagnetic interference includes: a set of analysis equipment, including at least one antenna for receiving electromagnetic emissions at a plurality of frequencies, a spectrum analyzer for measuring the amplitude of the emissions at least some of the frequencies, and a computer; and a support apparatus for enclosing and protecting the analysis equipment against tampering at least while the analysis equipment is in operation.

In features of this aspect, the support apparatus includes an equipment cabinet; the support apparatus includes a plurality of modular enclosures; the support apparatus includes a least one opening for exposing the antenna during operation of the analysis equipment; a common power source is integrated into the support apparatus for supplying power to the analysis equipment; and the common power source is a battery or a wall-connected outlet box.

In yet another aspect of the present invention, a method for using a computer system, having a graphical user interface including a display and a user interface selection device, to obtain input from a user to control the analysis of electromagnetic interference includes: soliciting, from a user, input indicative of at least one specific set of frequencies, each set of frequencies defining a configuration; soliciting, from the user, input indicative of a name for each of a plurality of configuration; displaying a list of defined configurations to the user via the display; and receiving, from the user, selection input indicative of the configurations to be included in the electromagnetic interference analysis.

In a feature of this aspect, receiving selection input includes soliciting, from a user, input indicative of a name for each of at least one test, and receiving, from the user, selection input indicative of the configurations to be included in each of at least a plurality of tests.

In still another aspect of the present invention, a method of analyzing electromagnetic interference includes the steps of: storing parameters for each of a plurality of configurations, each configuration corresponding to a plurality of frequencies in a frequency range, the parameters including a unique configuration identifier; creating a plurality of data sets, wherein a single configuration is associated with each data set; scanning the frequencies in a configuration for electromagnetic energy; as a result of the scanning step, storing data corresponding to each of the frequencies in one of the data sets; displaying a list of data sets; and for each data set in the list of data sets, displaying the unique configuration identifier for the configuration associated with the respective data set.

In features of this aspect, the same configuration may be stored with more than one data set, and the same unique configuration identifier may be displayed for more than one data set in the list of data sets; and the method further includes storing each data set in a separate file having a file name distinct from the unique configuration identifier for the configuration associated with the respective data set.

In still another aspect of the present invention, a method of analyzing electromagnetic interference for a predetermined period of time includes the steps of: scanning a first set of frequencies with an analyzer; recording, in a memory, data generated by the analyzer and corresponding to the first set of frequencies; after scanning the first set of frequencies, scanning a second set of frequencies with the analyzer; recording, in a memory, data generated by the analyzer and corresponding to the second set of frequencies; and repeating both scanning and both recording steps until the predetermined period of time has elapsed.

In features of this aspect, the method further includes accepting, from a user, input establishing the magnitude of the predetermined period of time; scanning the first set of frequencies includes scanning each frequency in the set a predetermined number of times; the predetermined number is one; and once the first scanning step is begun, both scanning steps and both recording steps are completed even if more than the predetermined period of time is required.

In still another aspect of the present invention, a method of analyzing electromagnetic interference in a building includes the steps of: defining a set of frequencies to be scanned by a spectrum analyzer; controlling the spectrum analyzer to measure the amplitude of electromagnetic energy at each frequency in the set of frequencies; repeating the controlling step a plurality of times, wherein each complete set of amplitudes measured by the spectrum analyzer defines a trace; and generating one or more statistical compilations of the traces created during the controlling steps, the statistical compilations including at least one function combination of the traces wherein the functional combination is selected from the group consisting of the difference between the maximum and average amplitudes of electromagnetic energy at the respective frequencies in the plurality of traces, the difference between the average and minimum amplitudes of electromagnetic energy at the respective frequencies in the plurality of traces, and the difference between the sum of the maximum and minimum amplitudes of electromagnetic energy at the respective frequencies in the plurality of traces and twice the average amplitude of electromagnetic energy at the respective frequencies in the plurality of traces.

In a feature of this aspect, the method further includes graphically displaying the functional combination of the traces.

BRIEF DESCRIPTION OF THE DRAWINGS

For a more complete understanding of this invention reference should now be made to the embodiments illustrated in greater detail in the accompanying drawings described below. In the drawings, which are not necessarily to scale:

FIG. 6 shows a preferred display screen corresponding to the analyzer configurations state of the user interface of FIG. 5;

FIG. 7 shows a preferred display screen corresponding to the test definitions state of the user interface of FIG. 5;

FIG. 8 shows a preferred display screen corresponding to the test execution state of the user interface of FIG. 5;

DETAILED DESCRIPTION OF THE PREFERRED EMBODIMENTS

The present invention will now be described fully hereinafter with reference to the accompanying drawings, in which a preferred embodiment of the present invention is shown. This invention may, however, be embodied in different forms and should not be construed as limited to the embodiment as set forth herein.

Figure 1:
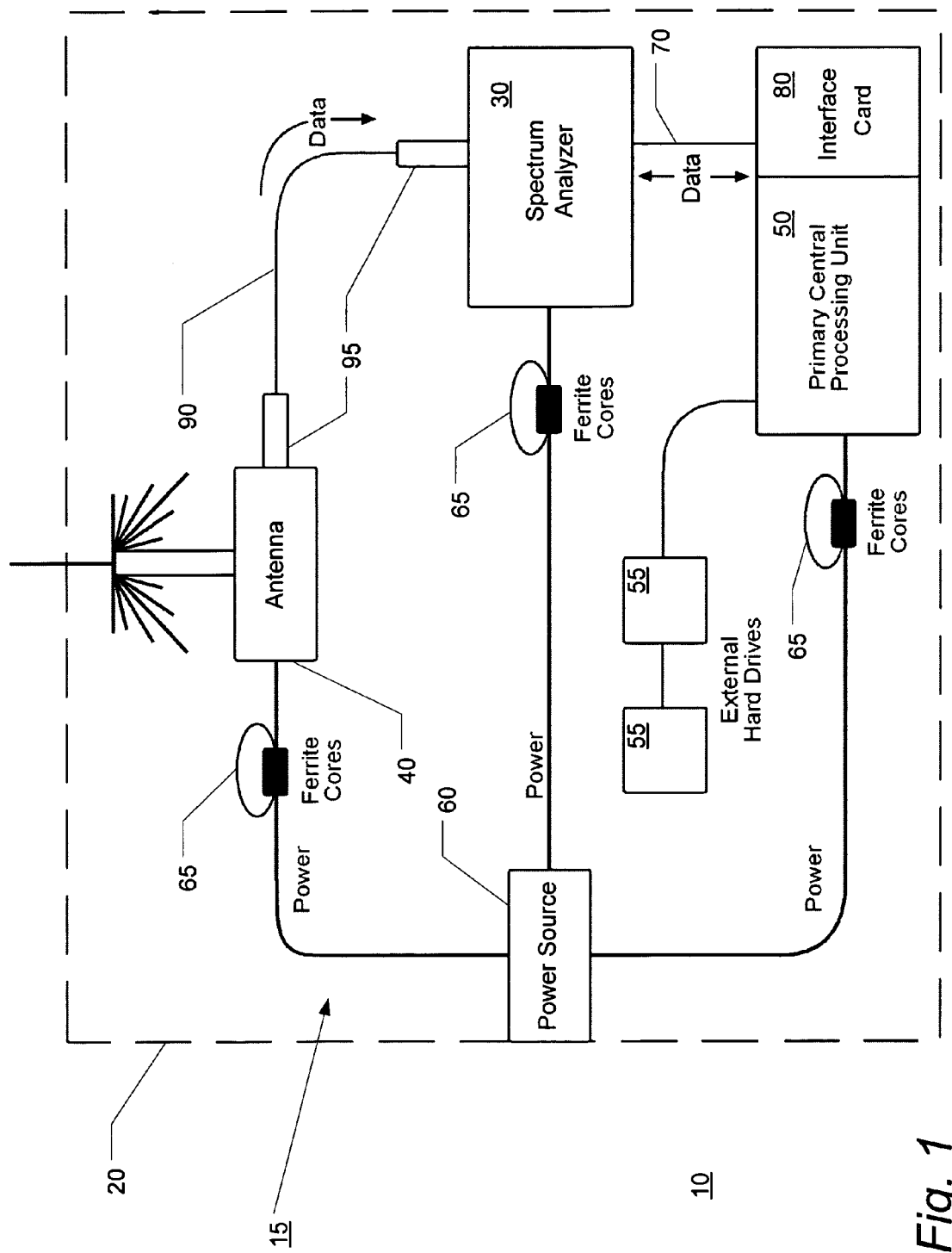
FIG. 1 is a block diagram representation of the hardware portion of a portable radiated emissions system in accordance with the preferred embodiments of the present invention.
Figure 2:
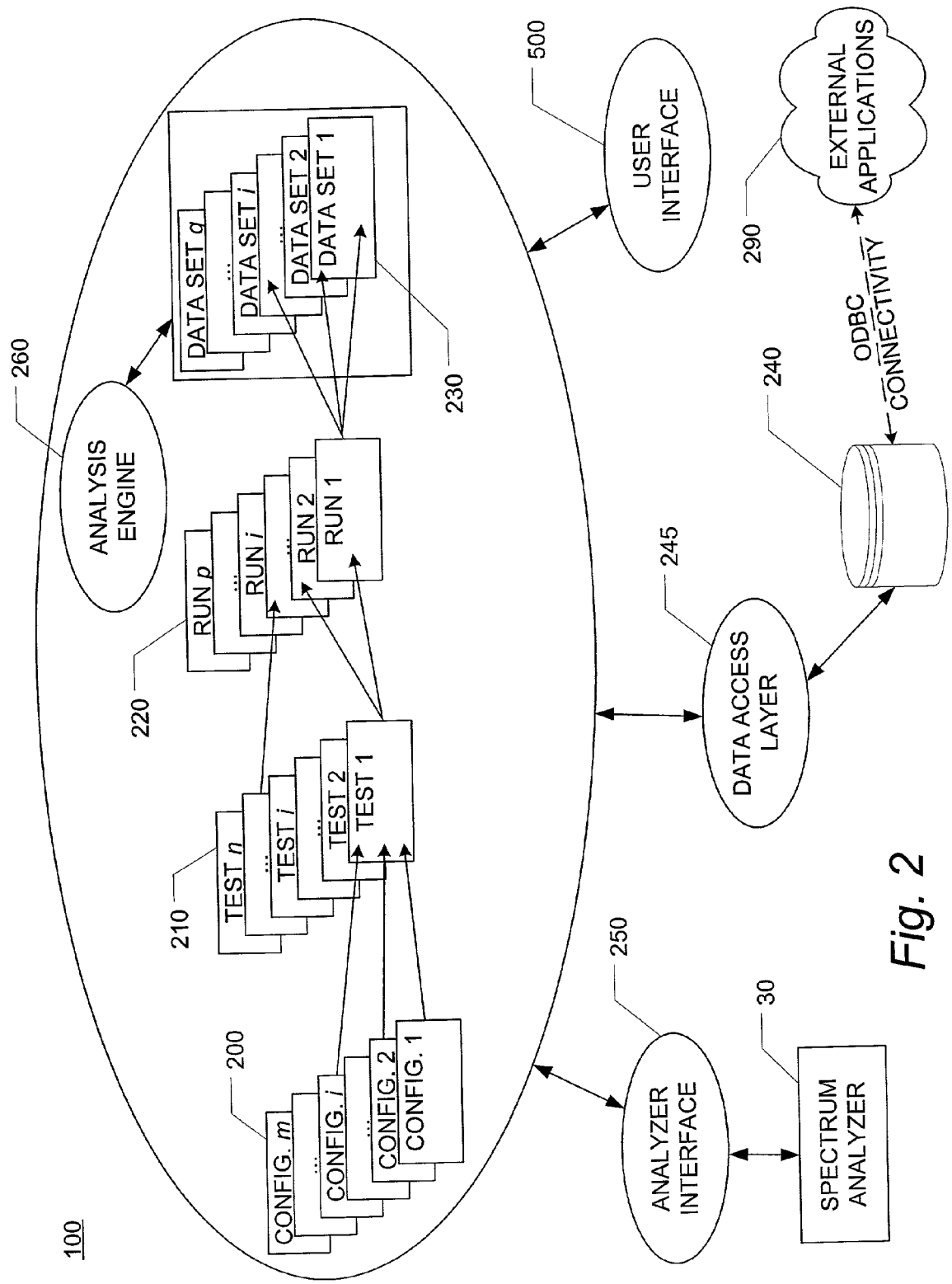
FIG. 2 is a block diagram representation of the architecture of the software portion of a portable radiated emissions system in accordance with the preferred embodiments of the present invention.

FIGS. 1 and 2 are block diagram representations of the hardware 10 and software 100, respectively, of a portable radiated emissions system in accordance with the preferred embodiments of the present invention. The hardware portion 10 comprises the analysis equipment 15 and a portable support apparatus 20 for transporting the analysis equipment 15. The analysis equipment 15 includes a spectrum analyzer 30 (referred to hereinafter as an "analyzer"), one or more antennae 40, and a primary central processing unit or computer 50 functioning under the control of the system's software 100, the functionality and operation of which is described below.

The portable support apparatus 20 is preferably constructed from materials of sufficient strength to protect the analysis equipment 15 during transport and operation thereof. A particularly advantageous portable support apparatus 20 may be constructed using a plastic material to provide support to the components of the analysis equipment 15 while avoiding any interaction with the electromagnetic fields that are being measured. Preferably, the cabinet 20 encloses the analysis equipment 15 to reliably support and retain the analysis equipment 15 during transport and to provide security for the equipment 15 during operation thereof, but allows the antenna 40 to be exposed to the environment during operation of the analysis equipment 15. In one preferred embodiment, the portable support apparatus 20 is an equipment cabinet. Wheels may be added to the cabinet 20 to facilitate easy movement thereof. A custom cabinet suitable for use in a preferred embodiment of the present invention may be developed and manufactured by Volunteer Case & Container, LLC of Oak Ridge, Tenn. Alternatively, because the combination of the equipment 15 and the cabinet 20 may be quite heavy and bulky, the portable support apparatus 20 may, in another preferred embodiment, include a plurality of modularized cases. In this embodiment, the equipment 15 may be stored and transported to a site in the modularized cases and assembled on-site.

As illustrated in FIG. 1, the analyzer 30 is operatively connected to the computer 50 via a cable 70. The computer 50 may be a conventional laptop computer containing the basic operating system, memory criteria, and disk drives found on commercially available laptop computers. A suitable interface card 80, such as a Hewlett Packard GPIB PCMCIA interface adapter card or a National Instruments IEEE interface card, may be used to facilitate bidirectional transmission of data between the computer 50 and the analyzer 30. The computer 50 allows users to set up, program, and control the analyzer 30 without having to interact directly with the analyzer 30. In association with the software 100 described below, the computer 50 may be used to set desired analyzer parameters, such as scan width and scan time among others, and to document customer site information such as the date and time of the measurements, the name of the site, site conditions, and a brief description of the survey purpose. In addition, the computer 50 and associated software 100 receive data captured by the analyzer 30 and enable users to review, analyze and manipulate this data.

Depending on the amount of testing done, the number of measurements taken, and on the amount of post-measurement processing done, very large volumes of data may be generated. Although memory space inherent in the computer 50, such as the computer's internal hard drive, may be used to store this data, larger volumes of data may be stored if one or more external hard drives 55 are utilized. The fact that these memory devices are physically external to the computer 50 may be transparent to the computer 50 and the software 100. External hard drives 55 also tend to be more accessible than internal drives, and thus may be easily disconnected from the rest of the equipment 15 and removed. This makes it possible to analyze captured data using a separate computer (not shown), disposed in a different location, without having to transport the entire system. If two external hard drives 55 are utilized, one drive 55 may be removed without affecting the overall operability of the system because another drive 55 still remains.

The analyzer 30 of the present invention should be capable of receiving control signals from the computer 50 and transmitting output data to the computer 50. In general, spectrum analyzers are used to measure the amplitude of electromagnetic energy at particular frequencies and the moments in time at which that energy is present. Preferably, the analyzer 30 is capable of processing electromagnetic energy in the frequency range of at least 10 kHz to 1 GHz because the vast majority of known end-use EMI problems occur in this frequency range, including those caused by fluorescent lighting and wireless communication devices. However, to the extent they are available, analyzers 30 having still wider frequency ranges are desirable because of their broader applicability. An analyzer suitable for use in the preferred embodiments of the present invention is the Hewlett-Packard ESA-L Series Model E4411B spectrum analyzer, which has a frequency range of 9 kHz to 1.5 GHz and a dynamic range of about 80 dB. In general, the frequency range of the system of the present invention is limited by the capabilities of the analyzer 30 and, to some extent, the antenna 40. It will be clear that the software 50 of the present invention may easily be modified to accommodate virtually any frequencies.

The antenna 40 may be a single antenna structure or may be formed from a plurality of antennae. In a preferred embodiment, the antenna 40 is a single extremely broadband portable receiving antenna 40. The antenna 40 is preferably designed specifically for accurate measurement of electric field intensity and suited for wide band emission testing and spectrum surveillance applications. As with the analyzer 30, the antenna 40 is preferably capable of detecting and receiving electromagnetic signals in the frequency range of at least 10 kHz to 1 GHz, although still broader frequency ranges are desirable. An antenna suitable for use with the present invention is the Antenna Research SAS-2/A antenna, which has a frequency response from 100 Hz to 1 GHz. Although this antenna is normally calibrated with its housing resting on a large ground plane, it can be used without a ground plane, with a subsequent change in antenna factor of less than 2 dB. A gradual roll-off in the response below 10 kHz prevents overload due to strong 60 Hz harmonics in areas where man-made noise is a problem. Schottky diodes may be utilized to give the low-band preamplifier additional protection from transients. Preferably, the monopole elements of the antenna 40 may be removed for compact storage. The antenna 40 may contain its own pre-amplifier, battery, and battery charger. It may be connected to the analyzer 30 via a cable 90 such as an RG 282/U coaxial cable, connected via RF attenuator pad "6 dB" and 50-ohm terminations 95.

The analyzer 30, computer 50 and antenna 40 may use a common power source 60. The common power source 60 preferably includes a radio frequency interference (RFI) filter and supplies power to the rest of the analysis equipment 15 via ferrite core power supplies 65. The ferrite cores provide protection against transients in the power being supplied to the equipment 15. Preferably, the power source is secured to, or integral with, the support apparatus 20, and the individual power supplies are reliably and securedly connected to the common power source 60 to prevent accidental or intentional loss of power to the analysis equipment 15. In one embodiment, the common power source 60 may be a simple wall-connected outlet box into which the individual power supplies may be plugged. On the other hand, because wall power may not be readily available in all locations 310 within a facility 300, or to provide greater reliability, the common power source 60 may also be an external battery. However, because typical scan times may vary from minutes to weeks, it is particularly advantageous for the analyzer 30, computer 50 and antenna 40 to all have the ability to be powered either from a 120-volt source or from an external battery.

As shown in FIG. 2, software 100 may be used in the present invention to facilitate automatic communication between the computer 50 and the analyzer 30. The creation of suitable software will be easily accomplished by one of ordinary skill in the art after studying the software architecture illustrated in FIG. 2 and the software functionalities and display formats discussed thereinafter. A particularly suitable tool for developing software suitable for use in the present invention is Hewlett-Packard-Agilent VEE Version 6.0 software, which is a Windows-based Visual Basic programming language for developing programs for instrument control and data acquisition. The software 100 is designed such that a variety of spectral measurements can be taken. These measurements may include, but are not limited to, minima, maxima, and averages of radiated electric field strengths. Spectral data from the analyzer 30 may also be displayed on the computer 50 when requested by an investigator, and, if the investigator desires to manipulate the spectral data, the manipulation process may be initiated and controlled from the computer 50. Through the use of the software 100, hundreds of spectra can be captured from site to site and automatically stored on the computer 50. This data may then be reviewed, manipulated, and printed out via the computer 50 once the data acquisition process is complete.

The software 100 includes a user interface 500 that is used to define m configurations 200, each of which represents a particular range of frequencies to be scanned by the analyzer 30. The user interface 500 may then be used to define n tests 210, each of which comprises one or more of the m configurations 200. A particular configuration 200 may be included in one test 210, more than one test 210 or no tests 210 at all. All of the defined configurations 200 and tests 210 may be stored in a database 240, which may be accessed through a data access layer 245. When a user wants to run one of the defined tests 210, a test run 220 may be created, and its attributes stored in the database 240. In FIG. 2, p represents the number of test runs 220 that have been defined. Each test run 220 preferably involves running one and only one test 210, but a particular test 210 may be run many different times using separately defined and controlled test runs 220. When a test 210 is run, each configuration 200 associated with that test 210 is run, and a separate data set 230 is created for each configuration 200 in the test 210. These data sets 230 may likewise be stored in the database 240.

The software 100 further includes an analyzer interface 250 for facilitating communications between the computer 50 and the analyzer 30. Such an interface 250 should be based on the specific software architecture utilized by the analyzer 30, and the development of such an interface 250 would be within the skill of one of ordinary skill in the art. The software 100 further includes an analysis engine 260 for processing and analyzing the data gathered by the analyzer 30, organized into data sets 230 and stored in the database 240. The analysis engine 260 is used under the control of the user interface 500 to calculate functional combinations, generate graphical representations of the data, and other complex processing chores. Finally, it should be noted that further functionality may be provided via other, external software applications 290 that take advantage of the data stored in the database 240 via standard ODBC or similar connectivity.

Figure 3:
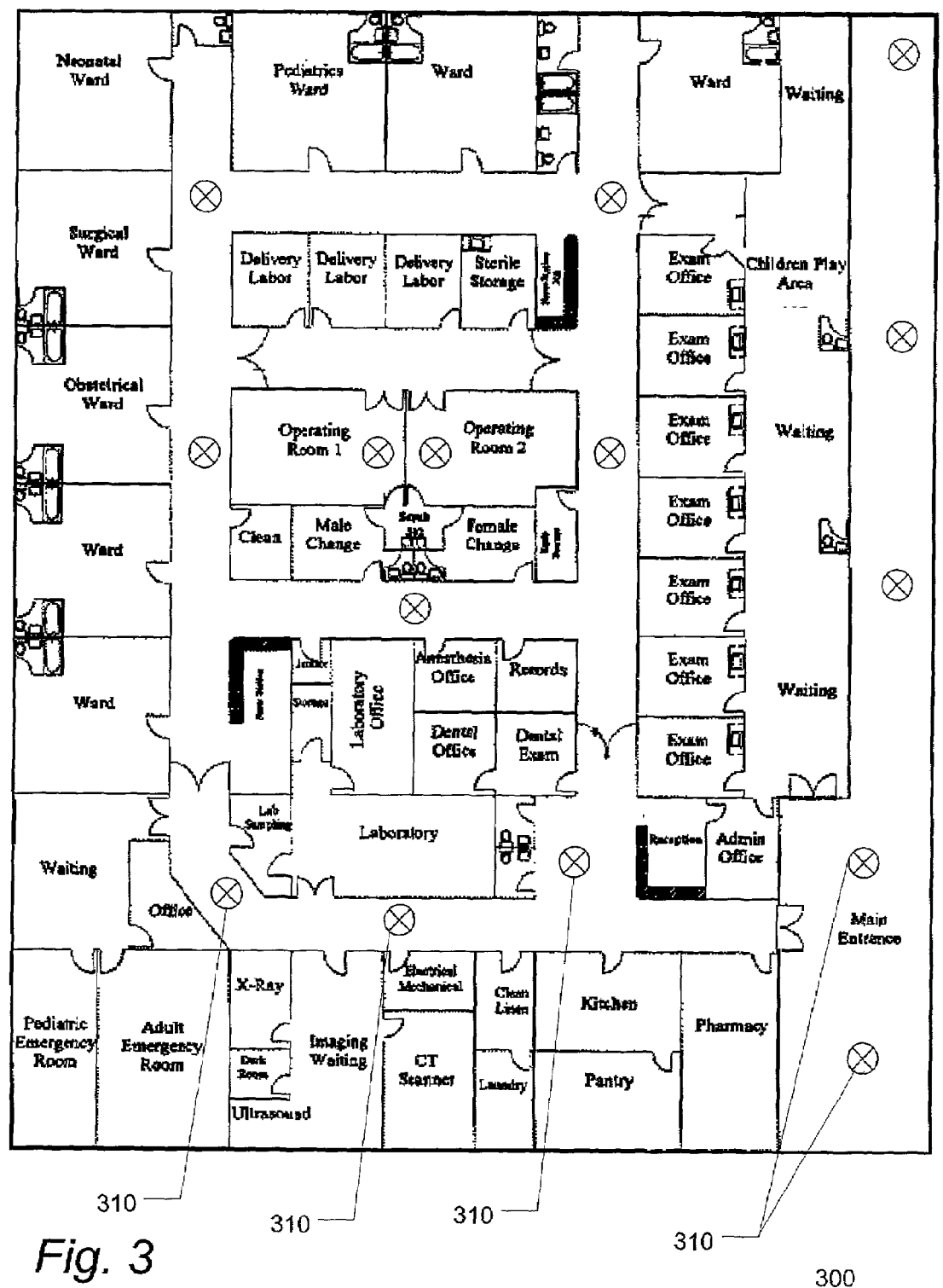
FIG. 3 depicts a representative floor plan of a typical facility in which the present invention may be utilized.

Together, the system hardware 10 and software 100 may be used to investigate EMI at a site of interest, which is usually, but not always, a commercial or industrial facility 300. FIG. 3 depicts a representative floor plan of a typical facility 300 in which the present invention may be utilized. The facility 300 is a small hospital, one floor of which is illustrated. This floor contains a waiting area, seven examination offices, a pharmacy, a laboratory, two emergency rooms, an X-ray room, a CT scanner room, eight patient wards, and other areas, any of which may contain sensitive electronic equipment. The requirements for an EMI problem to occur are very minimal: it takes only one component of electromagnetic energy (i.e., one event) of enough energy (amplitude) at the right frequency occurring at the right time and a piece of equipment susceptible to that component to create an EMI problem (assuming that a path exists between the source and receptor). Thus, in order to fully characterize the EMI in a facility 300 such as the one illustrated in FIG. 3, it may be preferable to measure EMI at each of a plurality of locations 310 therein. Suitable locations 310 may be determined by an experienced EMI investigator, but some possible locations 310 are indicated by the cross-hatch marks distributed around the facility 300.

The collection of data is further complicated by other factors as well. First, to improve the characterization of a facility environment and to increase the probability of identifying the source of an EMI problem, more data is required than that normally captured by a spectrum analyzer 30 operating in the manual mode. Because characterizations require knowledge of three important metrics—frequency, amplitude, and time (including date)—values corresponding to each of these metrics are captured by the apparatus for each data point. Additionally, some events that cause EMI problems do not occur frequently enough to be detected during typical characterizations. With typical characterization techniques using manual equipment, it is easy to miss problem-causing events, especially those that are random and infrequent. In some cases, interfering emissions occur infrequently placing the investigator in the difficult position of being unable to reach any conclusion as to how to solve the problem.

Before beginning any investigation with the system of the present invention or any other spectrum analyzer 30, it is desirable to develop a test plan for gathering sufficient EMI data to address all of the foregoing issues. The test plan preferably includes the definition of one or more tests 210 and the selection of a specific test or tests 210 for each desired location 310. The test plan may also include the specific parameters that are included in the definition of the tests 210 and the configurations 200 of which they are comprised.

Figure 4A:
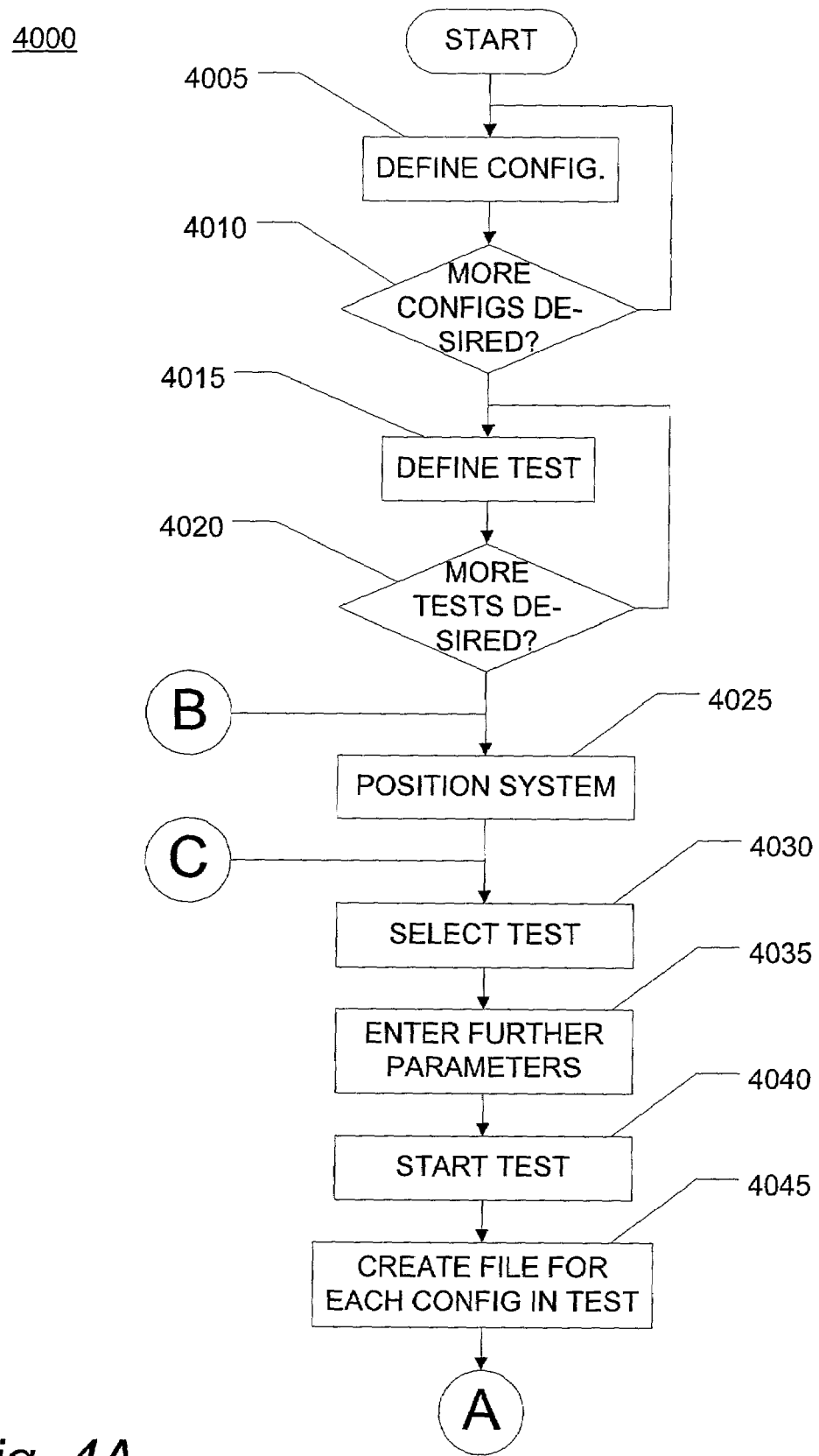
FIGS. 4A and 4B are flowchart diagrams illustrating the test and analysis process of the present invention.
Figure 4B:
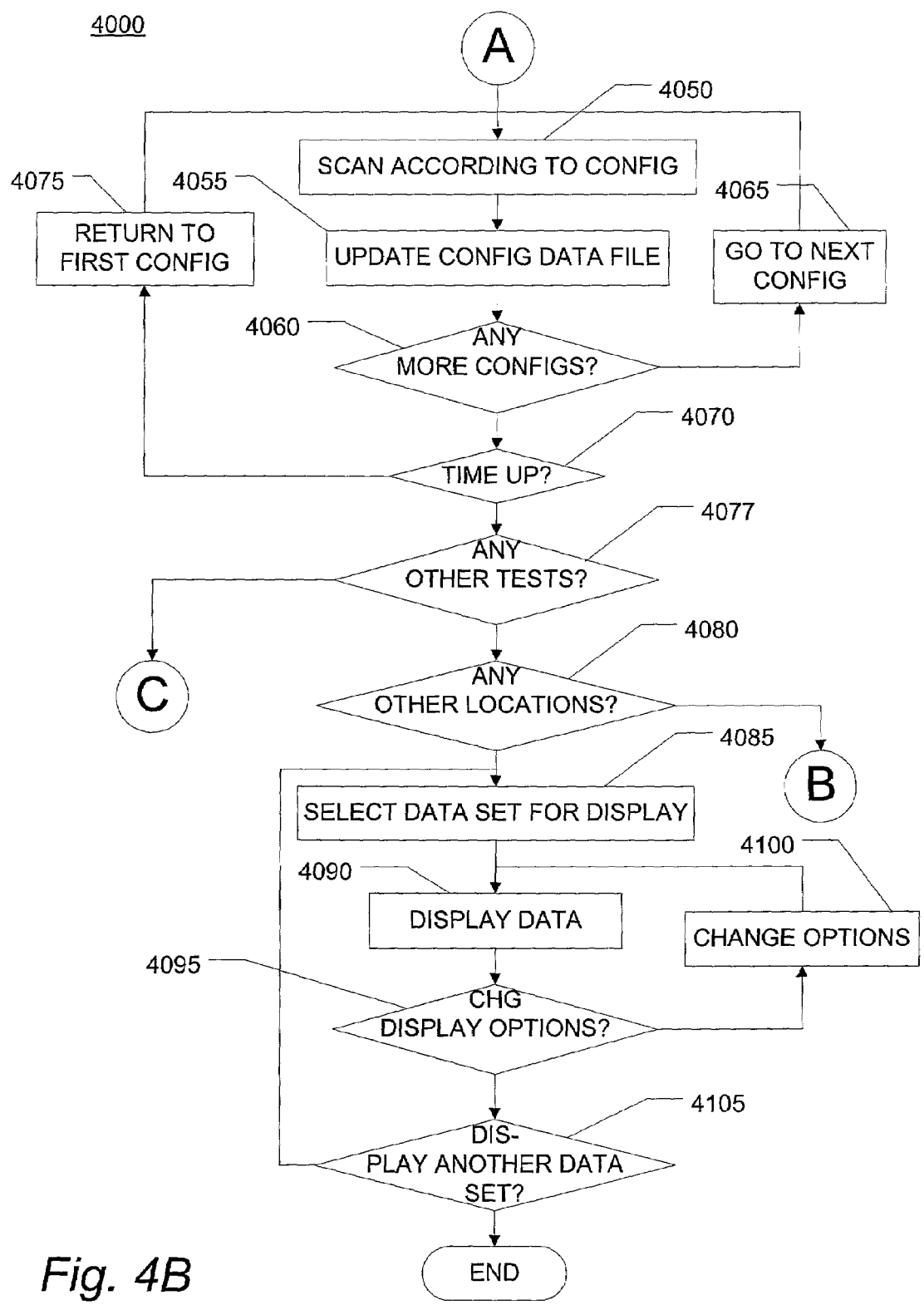

Once the test plan is developed, the actual test and analysis process 4000 may be implemented using the system of the present invention. FIGS. 4A and 4B are flowchart diagrams illustrating the test and analysis process 4000 of the present invention. It should be noted, however, that these diagrams and the descriptions accompanying them herein are presented only for purposes of illustration of the general operation of the portable radiated emissions system, and that the actual steps taken during operation thereof may be rearranged or even different from the steps illustrated herein. In all cases, however, the actual development of the software 100 would be easily accomplished by one of ordinary skill in the art on the basis of the descriptions and illustrations herein.

Operation of the test and analysis process 4000 begins at step 4005 with the definition, or specification, of a single configuration 200 by a user using the user interface 500. As noted previously, each configuration 200 represents a particular range of frequencies to be scanned by the analyzer 30. Other configuration attributes that may be specified are described in detail hereinbelow. Once the configuration 200 is defined, the user may return at step 4010 to define additional configurations 200 or may continue on to step 4015 to define, or specify, a test 210, again using the user interface 500. As noted previously, each test 210 is made up of one or more configurations 200. Other test attributes that may be specified are likewise described in detail hereinbelow. Once the test 210 is defined, the user may return at step 4020 to define additional tests 210 or may continue on to steps 4025–4080 to execute tests 210.

The execution of tests 210 begins at step 4025 with the positioning of the system in a desired location 310 in the facility 300 or other site. Of course, configurations 200 and tests 210 may be defined once the system is already in place in a test location 310, but many times it will be more convenient to define them in advance. Next, at step 4030, a test 210 may be selected for execution as a test run 220. At step 4035, the user interface 500 may again be utilized to define the parameters of the test run 220, described in detail hereinbelow, and at step 4040 the test run 220 is begun.

When executing the test run 220, the software 100 first creates a file, at step 4040, for each configuration 200 included in the test run 220. Each file holds the data set 230 created by the analyzer 30 as it scans or measures radiated emissions during the test run 220. Once the files have been created, the analyzer 30 next scans each frequency in the configuration 200 at step 4050, measuring the amplitude of electromagnetic energy that is being received by the antenna 40 at the scanned frequency at the moment in time that the particular frequency is being scanned. Thus, each measurement, often referred to herein as a "data point," includes a frequency measurement, an amplitude measurement, and a time measurement. As illustrated at step 4055, this data is then stored in the data file corresponding to the data set 230 established for the configuration 200 of frequencies being scanned. After all of the frequencies in the configuration 230 have been scanned, the software 100 determines whether any other configurations 200 in the test run 220 remain to be scanned. If so, then this measuring and storing procedure 4050–4065 is repeated for each such configuration 200. If not, or if there is only one configuration 200 in the test run 220, then further processing depends on whether the amount of time specified by the user for the test run 220 has elapsed or not. If time remains, then at step 4075 processing returns to the first configuration 200 in the test run 220 and all of the configurations 200 are scanned once again.

Because the test 210 selected for execution may include multiple configurations 200, and each configuration 200 may include a different frequency range or otherwise differing parameters, the configuration/test arrangement of the present invention thus permits the analysis equipment 15 of the present invention to be operated for an extended period of time without intervention from the user. In other words, instead of repeatedly manually programming a single configuration, operating a spectrum analyzer according to the configuration and organizing the output data, a user may merely select a predefined set of configurations 200 and execute one command to run all of them as a single test run 220, with a separate data set 230 being created for each configuration automatically. In addition, because the software 100 cycles through each configuration 200 in the selected test 210 repeatedly during the duration of the test run 220, the resulting data sets 230 cover a much longer period of time than would be possible if each configuration 200 were to be operated on individually. Further, not only is no intervention from the user required for multiple configurations 200 to be operated on, but the user may in fact leave the system completely unattended. This is further facilitated by the use of an enclosed support apparatus 20, which prevents the analysis equipment 15 from being tampered with in the absence of the user or security personnel.

Once the specified time elapses at step 4070, the entire measurement process may be repeated in either the same location 310 or a different location 310 in the facility 300. If at step 4077 the user wishes to run another test 210 in the same location 310, the user may choose to re-run the same test 210 or select a different one. If at step 4080 the user wishes to gather data at other locations 310, then the user merely needs to reposition the support apparatus 20 to the new location 310 at step 4025, select the test 210 at step 4030 and adjust any further parameters at step 4035, if necessary. The same test or tests 210 may be run again at the new location 310, or a different test 210 may be used. The selected test 210 may then be started at step 4045 and the data sets 230 created and filled at steps 4045–4070. Because of the simplicity of changing from one predefined test 210 to another, or of defining new tests 210 from predefined configurations 200, the user need spend only a minimal amount of time setting up the analyzer 30 at each new location 310 and virtually no time setting up and managing files for the data sets 230 that are created by the test runs 220.

If at step 4080 there are no locations 310 remaining for analysis, then the user will generally begin the process of analyzing the data that has been gathered during the test run or runs 220 and stored in the data sets 230, as shown at steps 4080–4105. This may be accomplished beginning at step 4085 by selecting a data set 230 for display at step 4090. If at step 4095 the user wishes to change the way the data is displayed, then the display options may be changed at step 4100 and the data redisplayed at step 4090. The data is displayed until the user is finished or until the user chooses at step 4105 to display a different data set 230. Steps 4085–4105 may be repeated as often as a user wishes, in order to aid in the analysis of the EMI in the facility 300.

Figure 5:
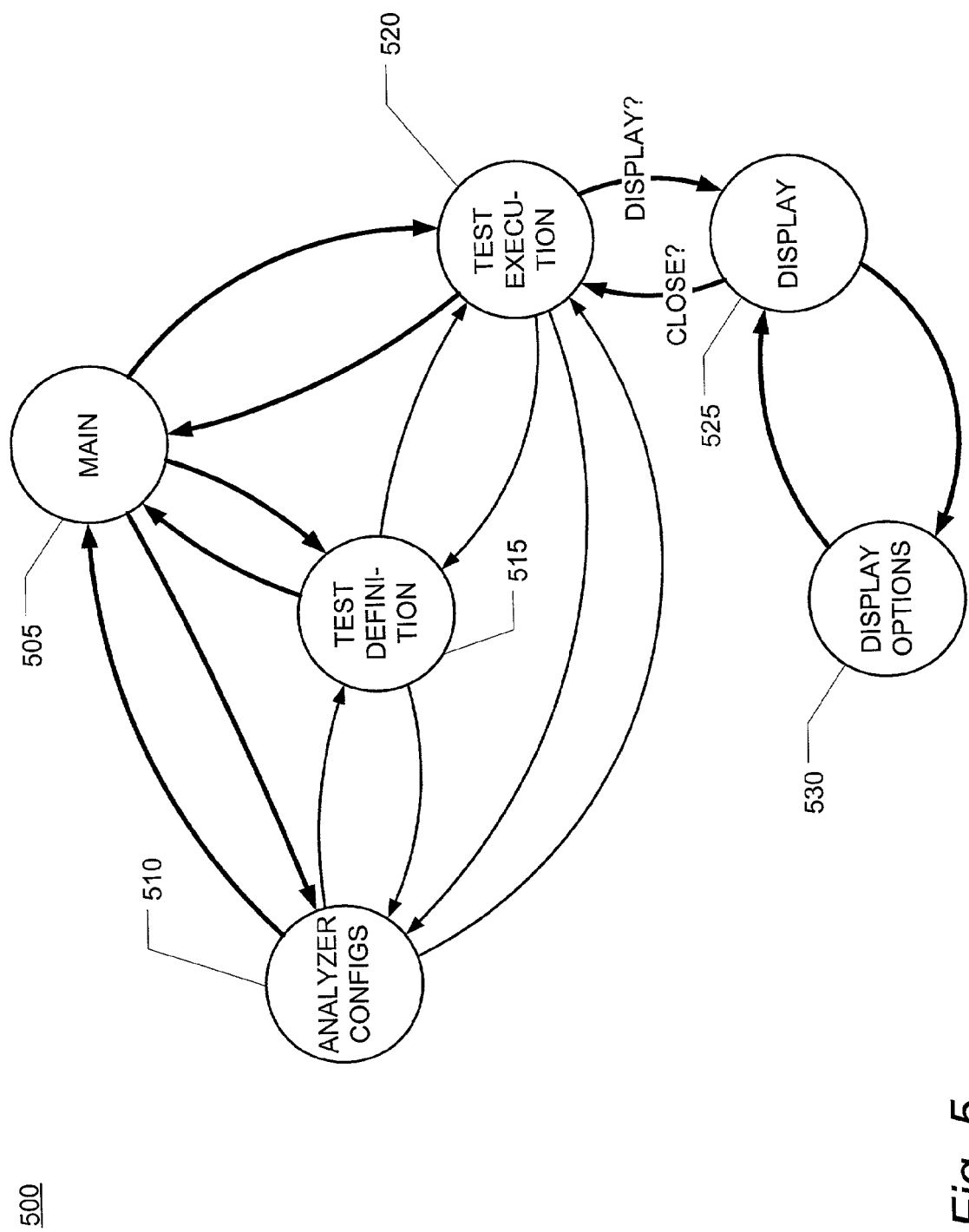
FIG. 5 is a state diagram of the user interface of the software of the present invention.

FIG. 5 is a state diagram of the user interface 500 of the software 100 of the present invention. The user interface 500 is the part of the software 100 that allows users to control the definition of configurations 200 and tests 210, the execution of test runs 220, and the review of graphs produced from the resulting data sets 230, as described with respect to the test process 4000 illustrated in FIGS. 4A and 4B. In FIG. 5, each circle represents a state in which a user has one or more options for either performing an action within the current state or for proceeding to another state. If the user chooses to perform an action within his current state, the action is performed and the user remains in the current state. If the user chooses to proceed to another state, as represented by an arrow leading from the current state to the new state, the user is transferred from his current state to the chosen state, and a new set of options becomes available to the user. A description of the states of a preferred embodiment of the user interface 500 and their interrelationship is described next. In the preferred embodiment, each state could, for example, represent one or more screen in a graphical user interface (GUI). In this case, the options available to a user in a state may be grouped and presented to the user in particular areas of the screen.

Figure 6:
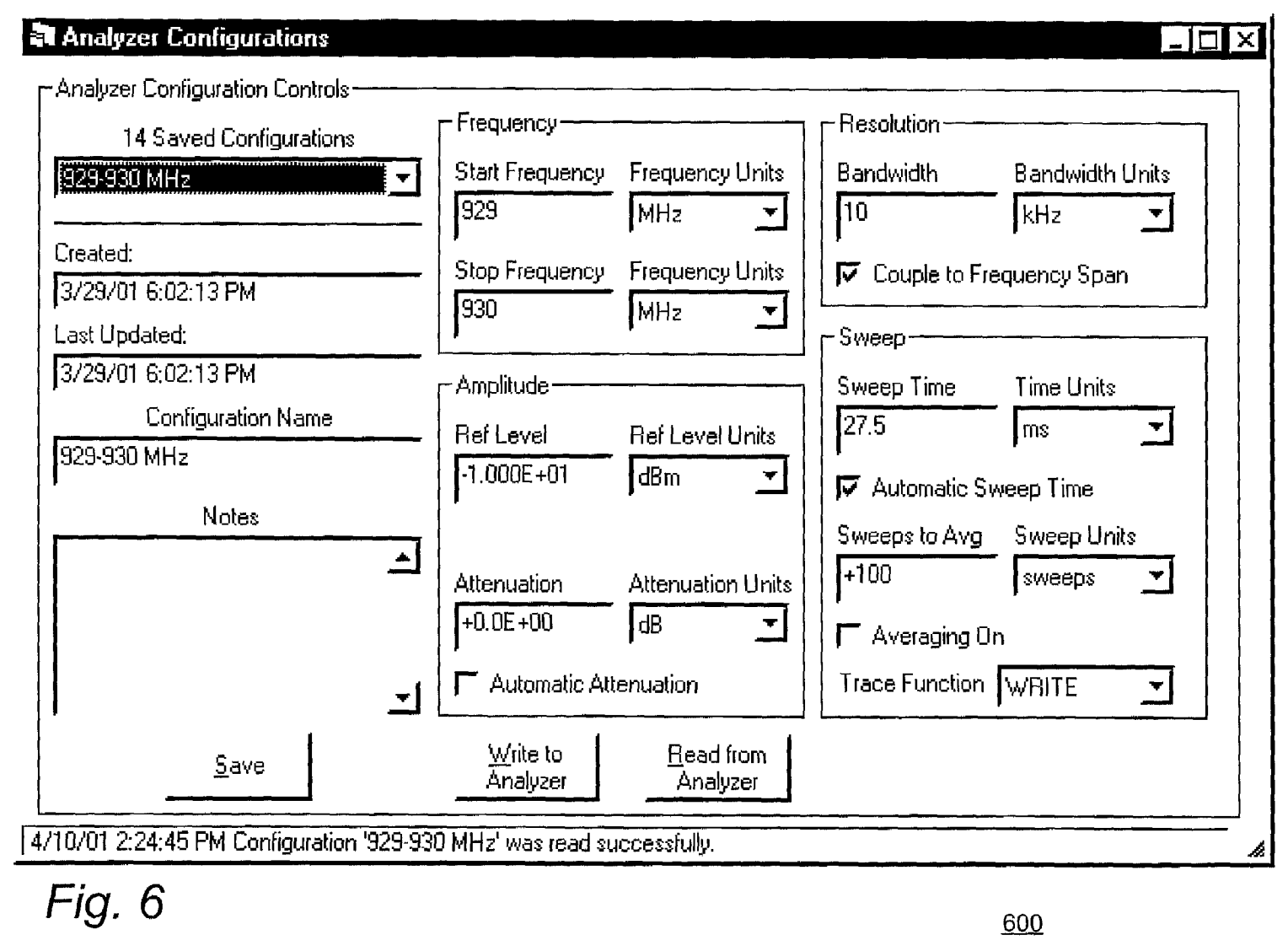

In a particularly advantageous embodiment, initiating the software 100 causes the user interface 500 to first enter a main state 505. In the main state 505, the user preferably has at least the following options: defining analyzer configurations 200 in an analyzer configurations state 510, defining tests 210 in a test definition state 515, and gathering or displaying test data in a test run 220 in a test execution state 520. If a user chooses to define configurations 200, then the user interface 500 proceeds to the analyzer configurations state 510. In the analyzer configurations state 510, the options available to the user may include, but are not limited to, the ability to select a saved configuration 200 for review or modification and the ability to specify site-specific information and frequency, amplitude, resolution and sweep parameters or attributes for a new or saved configuration 200. The user may also have the option to proceed directly to the test definition state 515 or the test execution state 520. FIG. 6 shows a preferred display screen 600 or "window" corresponding to the analyzer configurations state 510 of the user interface 500 of FIG. 5. A configuration 200 may either be selected from a list of saved configurations 200 or created by entering a new configuration name. Preferably, new configuration names may be specified using any alphanumeric name with enough characters to allow meaningful names to be assigned to configurations 200. In a preferred GUI, an existing configuration 200 may be retrieved for review or modification by selecting it from a pull-down menu. Also, preferably, the software 100 records the date and time that the configuration 200 was created and when it was last updated. In a preferred GUI, the respective times are displayed adjacent to, or in conjunction with, the name of the configuration 200 so that a user can keep track of when a configuration 200 was established and when it was most recently updated.

Site-specific information may preferably be associated with the configuration name as well. Information which may be recorded includes, but is not limited to, the name of the customer or facility where the investigation is carried out, the type of facility 300, information specific to the nature of the EMI problem, and the specific location 310 of the system in the facility 300. In a preferred GUI, this information may be recorded free-form in an adjacent "Notes" area of the display screen 600 corresponding to the analyzer configurations state 510, as illustrated in FIG. 6.

The user interface 500 may also give the user the ability to specify frequency attributes for the specified configuration 200. More particularly, the user interface 500 preferably gives the user the ability to specify the start and stop frequencies for the configuration 200. These frequencies together define the range of frequencies to be scanned. For convenience sake, each of these frequencies may preferably be input using both a numerical value and an associated unit of measure (e.g., Hz, kHz, MHz, GHz, and the like). In a preferred GUI, this information may be recorded in a "Frequency" area of the display screen 600 corresponding to the analyzer configurations state 510, as illustrated in FIG. 6.

The user interface 500 may also give the user the ability to specify amplitude attributes for the selected configuration 200. More particularly, the user interface 500 preferably gives the user the ability to specify the amplitude reference level and the attenuation for a configuration 200. For convenience sake, each attribute may preferably be input using both a numerical value and an associated unit of measure (e.g., dBm and the like for amplitude and dB and the like for attenuation). The range for the reference level and the range for the attenuation each preferably correspond to the respective ranges allowable by the analyzer 30. The user may also have the ability to enable an "automatic attenuation" feature. In some cases, it may be necessary to attenuate the incoming signal based on its strength to ensure that the maximum value is recorded within the display capabilities of the analyzer 30. When the automatic attenuation feature is enabled, the user is not allowed to specify the attenuation level in the attenuation box. In a preferred GUI, this information may be recorded in an "Amplitude" area of the display screen 600 corresponding to the analyzer configurations state 510, as illustrated in FIG. 6.

The user interface 500 may also give the user the ability to specify resolution attributes for the selected configuration 200. More particularly, the user interface 500 preferably gives the user the ability to specify the resolution bandwidth for the selected configuration 200. For convenience sake, the resolution bandwidth may preferably be input using both a numerical value and an associated unit of measure (e.g., Hz, kHz, MHz, GHz, or the like). The range for these frequencies preferably corresponds to those allowable by the analyzer 30. The user may also have the ability to enable a "couple to frequency span" feature. This feature imposes limits on the resolution bandwidth based on the difference between the stop and start frequencies to prevent taking measurements in the uncalibrated mode with respect to the analyzer 30. In a preferred GUI, this information may be recorded in a "Resolution" area of the display screen 600 corresponding to the analyzer configurations state 510, as illustrated in FIG. 6.

The user interface 500 may also give the user the ability to specify sweep attributes for the specified configuration 200. More particularly, the user interface 500 preferably gives the user the ability to specify, for the selected configuration, the sweep time and the number of sweeps to average during a measurement. For convenience sake, each attribute may preferably be input using both a numerical value and an associated unit of measure (e.g., milliseconds (ms) and seconds (sec) for sweep time and sweeps for sweeps to average). The range for the sweep time preferably corresponds to that allowable by the analyzer 30. The user may also have the ability to enable or disable the "averaging" feature of the analyzer 30, and the ability to specify a trace function for which averaging is applied. In a preferred GUI, all of the sweep attributes may be recorded in a "Sweep" area of the display screen 600 corresponding to the analyzer configurations state 510, as illustrated in FIG. 6, with the possible trace functions being presented to the user in a pull-down menu where the choices are Write, Maxhold, Minhold, and Blank.

Although as described previously, configurations 200 are generally organized into tests 210 before being executed by the analyzer 30, the user interface 500 may also give the user the ability to export the attributes of a particular configuration 200 directly to the analyzer 30 without first setting up a test 210 that includes the configuration 200. This may be useful if a user need to set the analyzer 30 up and view data in real time. Similarly, the user interface 599 may also give the user the ability to import attributes directly from the analyzer 30 into a configuration 200. In a preferred GUI, these functions may be accomplished directly from the analyzer configurations state 510 by clicking a "Write to Analyzer" button or a "Read from Analyzer" button, respectively, at the bottom of the display screen 600 corresponding to the analyzer configurations state 510, as illustrated in FIG. 6.

Figure 7:
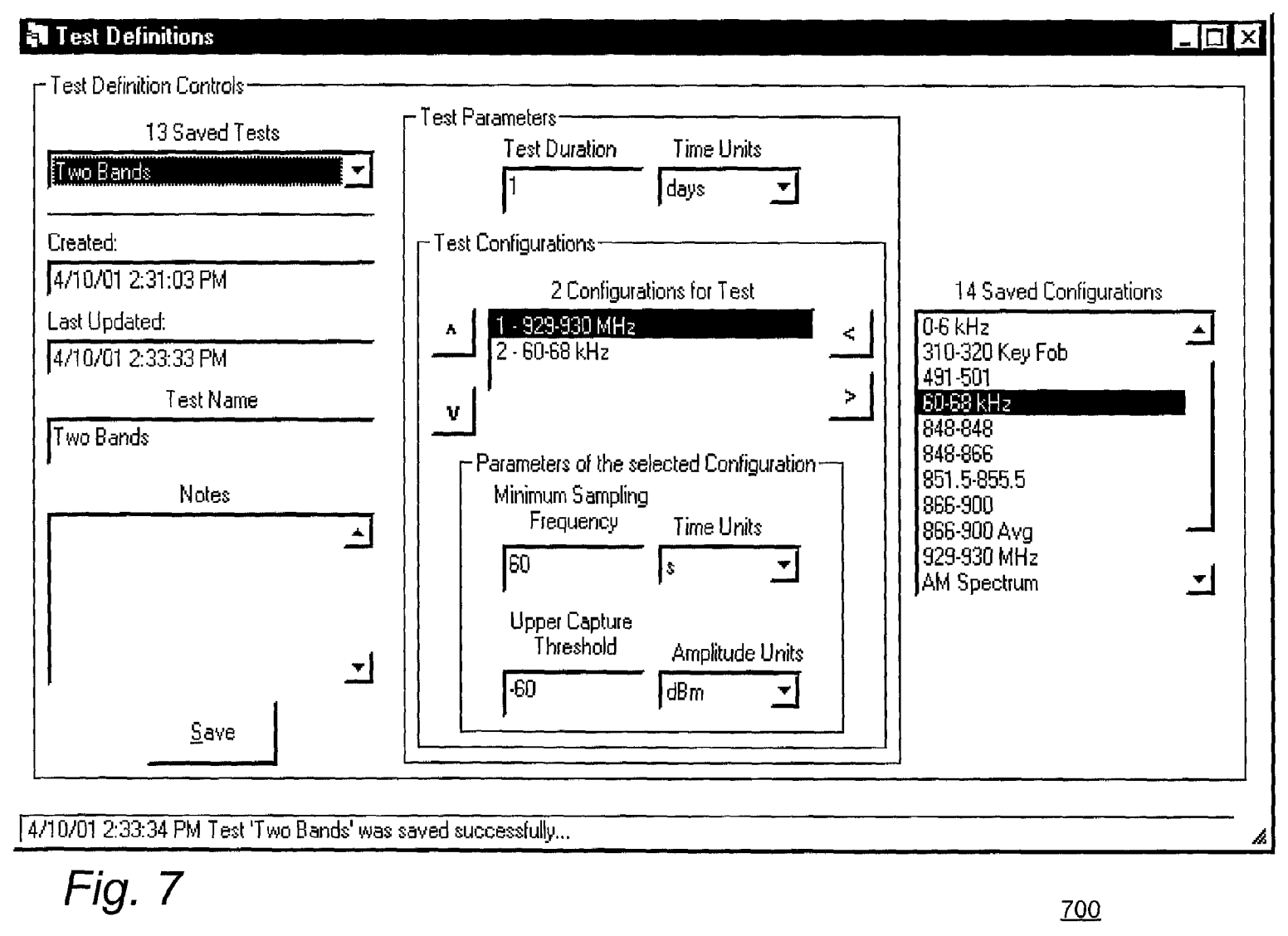

Returning to the main state 505, if a user instead chooses to define tests 210, then the user interface 500 proceeds to the test definitions state 515. In the test definitions state 515, the options available to the user may include, but are not limited to, the ability to select a saved test 210 for review or modification and the ability to specify test definition attributes and test parameters and to select or deselect saved configurations 200 for inclusion in the selected test 210. The user may also have the option to proceed directly to the analyzer configurations state 510 or the test execution state 520. FIG. 7 shows a preferred display screen 700 or "window" corresponding to the test definitions state 515 of the user interface 500 of FIG. 5. A test 210 may either be selected from a list of saved tests 210 or created by entering a new test name. Preferably, new test names may be specified using any alphanumeric name with enough characters to allow meaningful names to be assigned to tests 210. In a preferred GUI, an existing test 210 may be retrieved for review or modification by selecting it from a pull-down menu. Also, preferably, the software 100 records the date and time that the test 210 was created and when it was last updated. In a preferred GUI, the respective times are displayed adjacent to, or in conjunction with, the name of the test 210 so that a user can keep track of when a test 210 was established and when it was most recently updated.

Site- or use-specific information may preferably be associated with the selected test 210 as well. Information which may be recorded includes, but is not limited to, why specific frequency, amplitude, resolution, and sweep parameters were selected for a configuration and why one type of test may be used for an EMI investigation instead of another. In a preferred GUI, this information may be recorded free-form in an adjacent "Notes" area of the display screen 700 corresponding to the test definitions state 515, as illustrated in FIG. 7.

The user interface 500 may also give the user the ability to specify parameters for the test 210. More particularly, the user interface 500 preferably gives the user the ability to specify the duration of the selected test 210, the configurations 200 to be included in the selected test 210, and additional parameters for each included configuration 200. The test duration parameter determines the length of time that the selected test 210 is run at a specific location 310 at the site. This parameter becomes the initial value of the timer that is checked in step 4070 of the test and analysis process 4000. It should be noted that in the preferred embodiments described herein, the actual duration of the test run 220 will nearly always be longer than this value because once steps 4050–4065 are begun, all of the configurations 200 in the test 210 will be rerun, even if the total amount of time consumed is greater than the test duration parameter. For convenience sake, the test duration may preferably be input using both a numerical value and an associated unit of measure (e.g., days, hours, minutes, seconds, milliseconds or the like). In a preferred GUI, this information may be recorded in a "Test Parameters" area of the display screen 700 corresponding to the test definitions state 515, as illustrated in FIG. 7.

The configuration selector provides the user with the ability to build a test 210 according to the series of configurations 200 that are needed to characterize the facility environment. Preferably, analyzer configurations 200 that were previously created in the analyzer configuration state 510 may be selected from the menu of m saved analyzer configurations 200, wherein m refers to the number of defined analyzer configurations 200. In a preferred GUI, the configurations 200 may be selected from a list displayed adjacent to the Test Parameters area on the display screen 700, as illustrated in FIG. 7, and the configurations 200 that are currently included in the selected test 210 are displayed in the Test Parameters area on the display screen 700. Preferably, a pair of selectable "buttons" are provided to enable to add to (using, for example, a button labeled "<") or delete from (using, for example, a button labeled ">") the configurations 200 currently included in the selected test 210, from the list of available configurations 200. Preferably, the user interface 500 also gives the user the ability to reorder the configurations 200 that are included in the selected test 210, using, for example, buttons labeled with "up" and "down" arrows and located in or adjacent to the Test Parameters area.

Additional configuration parameters which may be controlled by the user in the test definitions state 515 include the minimum sampling frequency and the upper capture threshold for each configuration 200. The minimum sampling frequency represents the number of environmental measurements that are conducted in a particular unit of time. For convenience sake, the minimum sampling frequency may preferably be input using both a numerical value and an associated unit of measure (e.g., kiloseconds, seconds, milliseconds, microseconds or the like). The upper capture threshold represents a threshold criterion for capturing data. Preferably, if the amplitude of a measurement data point does not exceed this threshold, then that data point is not recorded in the data set 230. If no data is recorded for the first (sf−1) data points, wherein sf refers to the minimum sampling frequency, then a data point is recorded at the end of the sampling time. This ensures that at least one data point is recorded for a given sampling period.

Figure 8:
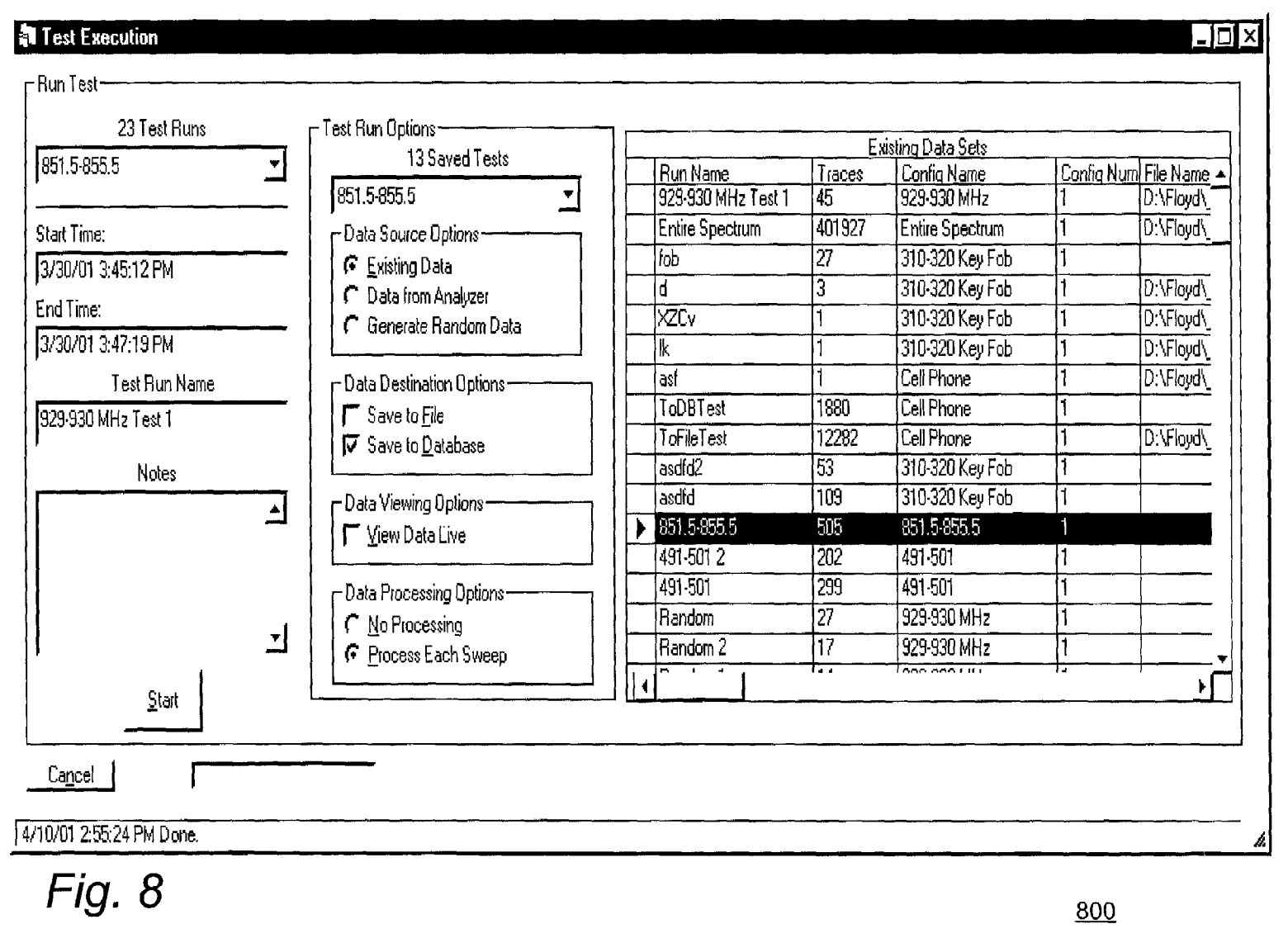

Returning to the main state 505, if a user instead chooses to gather or replay test data in a test run 220, then the user interface 500 proceeds to the test execution state 520. In the test execution state 520, the options available to the user may include, but are not limited to, selecting and executing a test 210 to generate data from the analyzer 30, reviewing information about a previous test run 220, replaying data from an existing data set 230, and generating random data. The user may also have the option to proceed directly to the analyzer configurations state 510 or the test definition state 515. FIG. 8 shows a preferred display screen 800 or "window" corresponding to the test execution state 520 of the user interface 500 of FIG. 5. As illustrated therein, the user may choose to select and execute a test 210 by selecting the appropriate option in a "Data Source Options" area of the display screen 800. Preferably, the computer 50 must be connected to the analyzer 30 and communicating with the analyzer 30 in order for this option to be active.

If a test 210 is to be run, the user may select one saved test that was previously created in the test definitions state 515 of the user interface 500. After selecting the test to be carried out, the user may define a new test run 220 by entering a new test run name. Preferably, new test run names may be specified using any alphanumeric name with enough characters to allow meaningful names to be assigned to test runs 220. Site- or use-specific information may preferably be associated with the selected test run 220 as well. Information which may be recorded includes, but is not limited to, why the test 210 was carried out, information regarding the data, and information describing the EMI problem or site. In a preferred GUI, this information may be recorded free-form in an adjacent "Notes" area of the display screen 800 corresponding to the test execution state 520, as illustrated in FIG. 8.

The user interface 500 may also give the user the ability to specify parameters for the test run 220. More particularly, the user interface 500 preferably gives the user the ability to specify where the data generated during the test run 220 is saved, to control whether the data may be viewed "live" on the computer 50 as it is being generated by the analyzer 30, and to control when data is processed. With regard to specifying where data is saved, the user interface 500 preferably gives the user the ability to specify whether data generated by the analyzer 30 during the test run 220 is saved to a specific file or merely saved generally to the database 240. In a preferred GUI, this attribute may be selected in a "Data Destination Options" area of the display screen 800 corresponding to the test execution state 520, as illustrated in FIG. 8. With regard to whether the data may be viewed "live," in a preferred GUI, this attribute may be selected in a "Data Viewing Options" area of the display screen 800 corresponding to the test execution state 520, as illustrated in FIG. 8.

With regard to when data is processed, the user interface 500 preferably gives the user the ability to control whether the data is processed "on the fly" or not. As used herein, data processing refers to the manipulation of the data gathered by the analyzer 30 to calculate functional combinations, graphical representation, and the like, rather than merely relaying the data to the hard drives 55 for storage. It may be more efficient to perform such data processing as the data is gathered (usually upon the completion of each sweep by the analyzer 30), but data processing slows down the performance of the system and consumes significant memory resources. Thus, it may be useful to defer data processing until after the scanning and measuring process, when more system resources may be devoted to it. In other cases, no data processing is likely to ever be performed on a particular set of data. For example, when defining configurations 200 and tests 210 and developing a test plan, a user may wish to execute sample test runs before initiating the final test plan. This allows him to examine the data being collected to help ensure that the analyzer 30 configurations and test plan produce acceptable data. Preferably, on-the-fly data processing may be prevented by enabling the "No Processing" attribute. On the other hand, enabling the "Process Each Sweep" attribute allows the data from each sweep to be processed upon the completion of the sweep. In a preferred GUI, this attribute may be selected in a "Data Processing Options" area of the display screen 800 corresponding to the test execution state 520, as illustrated in FIG. 8.

Once a test 210 has been selected for a test run 220, the test run 220 has been named, and all of the attributes or parameters for the test run 220 have been selected or specified, the test run 220 may be initiated. In a preferred GUI, this may be done by clicking a "Start" button on the display screen 800 corresponding to the test execution state 520, as illustrated in FIG. 8. The "Start" button is preferably enabled only when the test run 220 has been named. The software may record the date and time that the test run 220 was initiated and, upon completion, when it was completed. This information may be useful in helping an investigator determine when an EMI problem occurred.

Rather than selecting an executing a test run 220, a user may wish to review information about a previous test run 220. Information about a previous test run may preferably be accessed in at least two different ways. First, the start and stop times for a test run and any "Notes" recorded for the test run 220 may be viewed by selecting a particular test run 220 from a list of saved test runs 220. In a preferred GUI, an existing test run 220 may be retrieved for review or modification by selecting it from a pull-down menu, and the respective times are displayed adjacent to, or in conjunction with, the name of the test run 220 so that a user can keep track of when the test run 220 occurred. Second, additional information about the data sets 230 generated by a particular test run may preferably also be viewed. Information that is available for each data set 230 in a test run 230 may include the number of traces, the name of the configuration 200 for which the data set 230 was generated, the configuration number, and the name of the file where the data set 230 is stored. In a preferred GUI, this information is displayed in tabular format in a "Existing Data Sets" area of the display screen 800 corresponding to the test execution state 520, as illustrated in FIG. 8. Preferably, the widths of the columns in this area are adjustable by the user by placing the cursor between the columns at the top of the column, clicking on this intersection, and dragging to the left or to the right to decrease or increase column width, respectively.

A user may wish to display or "replay" data from an existing data set 230 that was created during a previous test run 220. The user interface 500 preferably gives the user the ability to display the data in any of the previously-created data sets 230 by displaying for viewing a graphical representation of the data. In a preferred GUI, an existing data set 230 may be selected for display by first selecting the appropriate option in a "Data Source Options" area of the display screen 800 and then selecting the desired data set 230 by placing a cursor over the entry for the data set 230 in the Existing Data Sets area of the display screen 800. Once a data set 230 has been selected, then the "Start" button may be clicked to display the data. Notably, because existing data is data that by its nature has already been collected and stored, many of the attributes used when data is being gathered from the analyzer 30, including the data destination options, data viewing options, and data processing options described above, have no applicability when existing data is being replayed.

Figure 9:
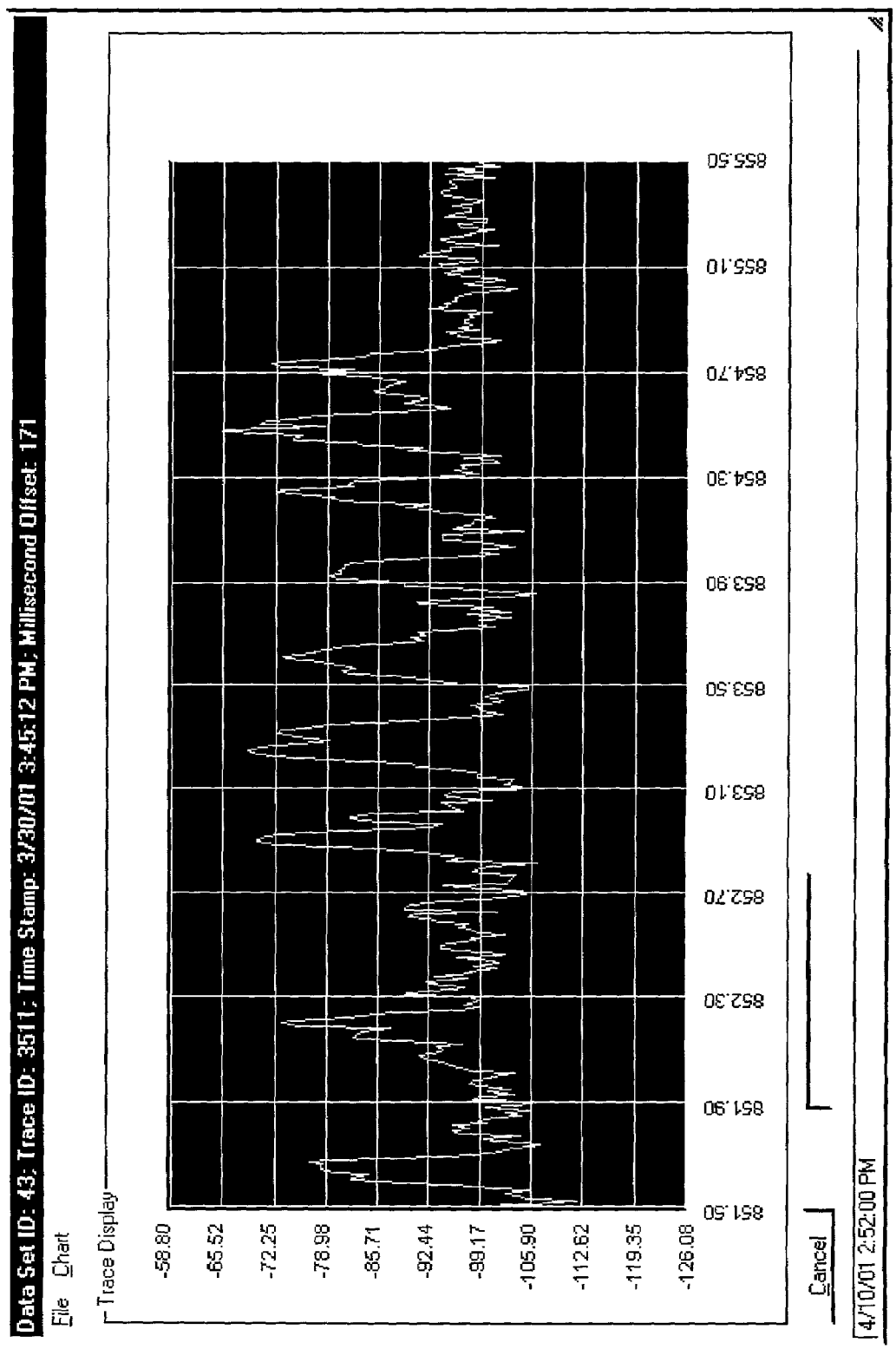
FIG. 9 shows a preferred display screen for displaying a graphical representation of data stored in an existing data set.

When an existing data set 230 is selected for display and the "Start" button is clicked as described above, then the user interface 500 proceeds to a display state 525 wherein the data may be graphically displayed on the computer 50. FIG. 9 shows a preferred display screen 900 or "window" for displaying a graphical representation of data stored in an existing data set 230. More specifically, the graph illustrated in FIG. 9 represents the data points for one trace from a data set 230 corresponding to a configuration 200 set up to scan frequencies from 851.50 kHz to 855.50 kHz. As illustrated, the frequencies included in the data set 230 are shown along the x-axis, the amplitudes of data points corresponding to the various frequencies are shown along the y-axis, and time and date information about when the data points were gathered is shown at the top of the display 900. Other data displayed in the display state 525 may include information identifying the data set 230 to which the displayed data corresponds and information identifying the particular trace being displayed (if applicable).

From the display state 525, the user the user preferably has the choices of modifying the display options and returning to the test execution state 520. If a user chooses to modify the display options, then the user interface 500 proceeds to a modify display options state 530. In the analyzer modify display options state 530, the options available to the user may include, but are not limited to, the ability to adjust the scale, to control whether gridlines are displayed, to select what graphs should be included in the display, and to filter out some of the data points on the basis of certain criteria. In a preferred GUI, each of these options is accessible by clicking an appropriate tab from any display screen 1000, 1100, 1200, 1400 in the modify display options state 530, as illustrated in FIGS. 10–12 and 14.

Figure 10:
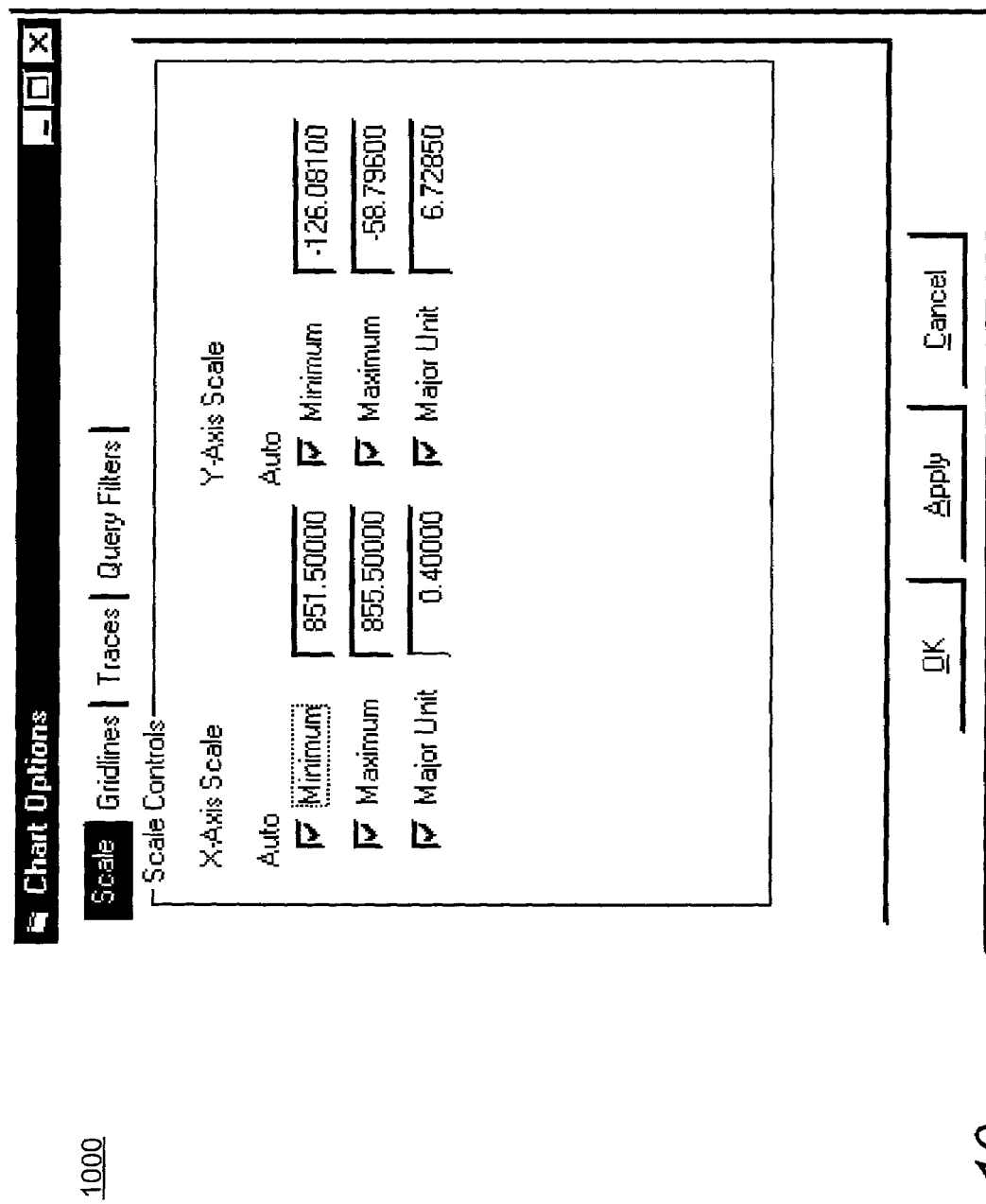
FIG. 10 shows a preferred display screen corresponding to a "Scales" tab in the modify display options state of the user interface.

If the user chooses to adjust the scale used in the display state 525, then the user interface 500 proceeds to display a set of scale options to the user. FIG. 10 shows a preferred display screen 1000 or "window" corresponding to the "Scales" tab in the modify display options state 530 of the user interface 500. The user interface 500 preferably gives the user the ability to control, for each axis, such standard parameters as the graph minimum and maximum and the size of the major unit used. Preferably, the user interface 500 also provides the user with an automatic scaling feature, which may be especially useful if the user does not want to be burdened with choosing the appropriate scale if an interfering component is identified that needs to be enlarged for further analysis. After selecting and applying the desired scale options, the user may choose to adjust or control other options or to return to the display state 525.

Figure 11:
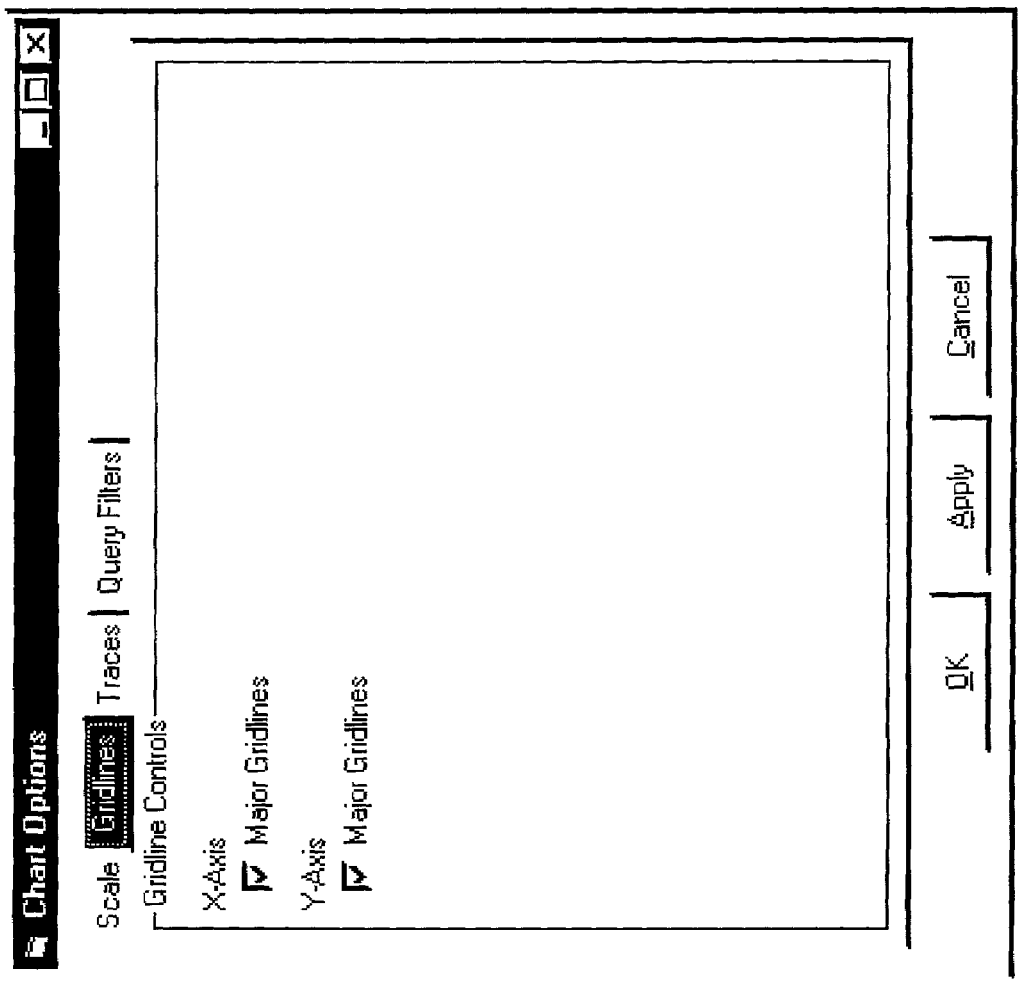
FIG. 11 shows a preferred display screen corresponding to a "Gridlines" tab in the modify display options state of the user interface.

If the user chooses to control whether gridlines are displayed in the display state 525, then the user interface 500 proceeds to display a set of gridline options to the user. FIG. 11 shows a preferred display screen 1100 or "window" corresponding to the "Gridlines" tab in the modify display options state 530 of the user interface 500. The user interface 500 preferably gives the user the ability to control, for each axis, whether gridlines are superimposed over the graphical representation of the data displayed in the display state 525. If displayed, the gridlines are spaced according to the major units specified at the "Scales" tab illustrated in FIG. 10. This type of gridline control is especially useful if gridlines are needed to identify an interfering component that was captured during a characterization. After selecting and applying the desired gridline options, the user may choose to adjust or control other options or to return to the display state 525.

Figure 12:
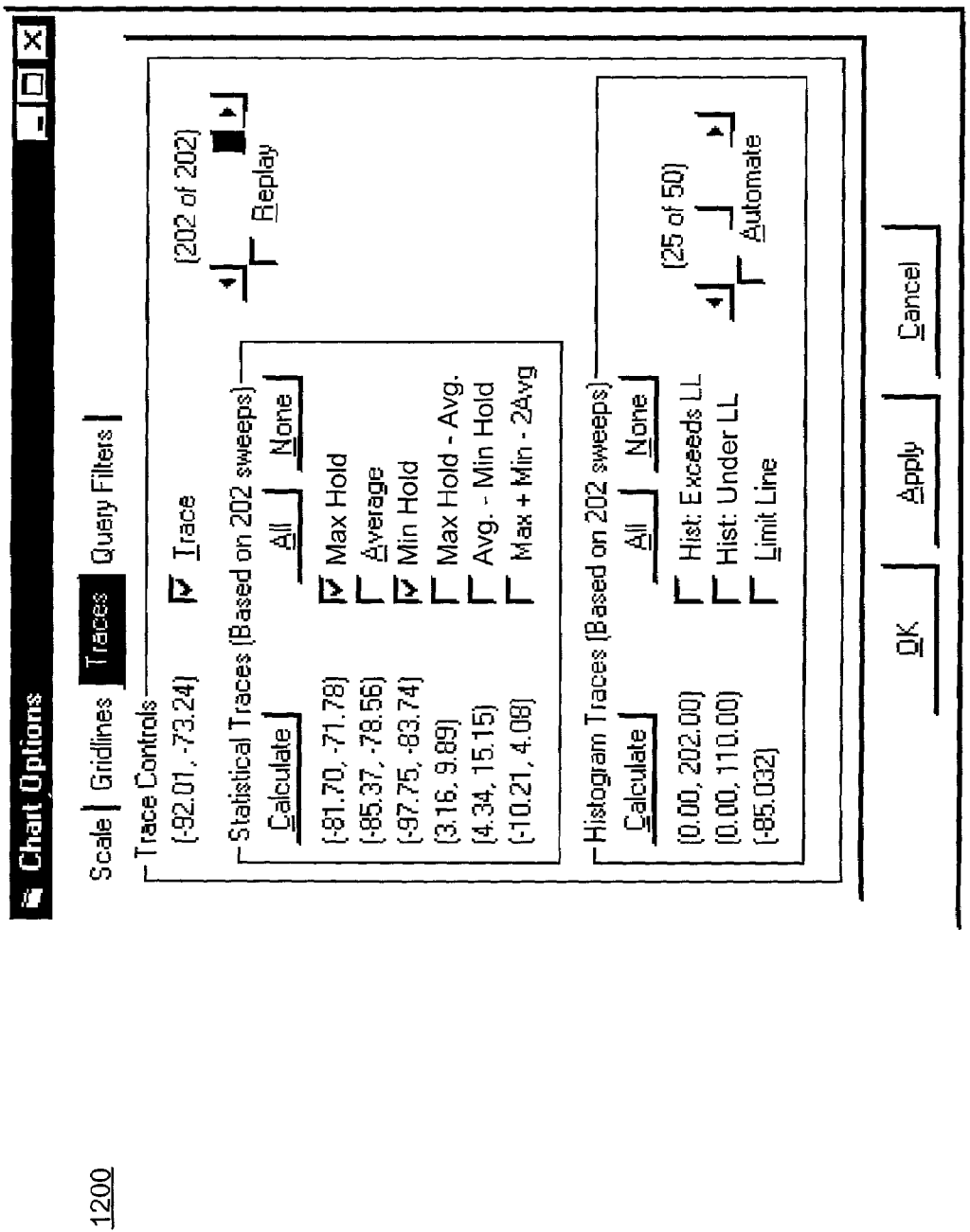
FIG. 12 shows a preferred display screen corresponding to a "Traces" tab in the modify display options state of the user interface.

If the user chooses to select what graphs should be included in the display state 525, then the user interface 500 proceeds to display a set of trace options to the user. FIG. 12 shows a preferred display screen 1200 or "window" corresponding to the "Traces" tab in the modify display options state 530 of the user interface 500. The user interface 500 preferably gives the user the ability to select a single graph for display on the computer 50 or to display a plurality of graphs at the same time. Graphs of both individual traces and statistical compilations of trace information which preferably include, but are not limited to, functional combinations of all the traces that are included in the selected data set 230, histograms of the trace data and the like. Each graph type on the list of available graphs may be assigned a unique color that corresponds to the color of that specific graph when it is subsequently displayed on the computer 50. After selecting and applying the desired trace options, the user may choose to adjust or control other options or to return to the display state 525.

Available functional combinations of traces may include basic functional combinations, such as maximum hold, average, and minimum hold, and various special combinations, such as (maximum hold−average), (average−minimum hold) and (maximum hold+minimum hold−2×average). In a preferred GUI, the user may select which of these functional combinations are to be displayed on the computer 50 in the display state 525 by checking the corresponding box to the left of the statistic's name in a "Statistical Traces" area of the display screen 1200 corresponding to the traces display screen 1200, as illustrated in FIG. 12. If the functional combinations have not already been generated, they may be generated by clicking an adjacent "Calculate" button. In addition, the minimum and maximum values for each graph type are displayed in the same area.

Figure 13:
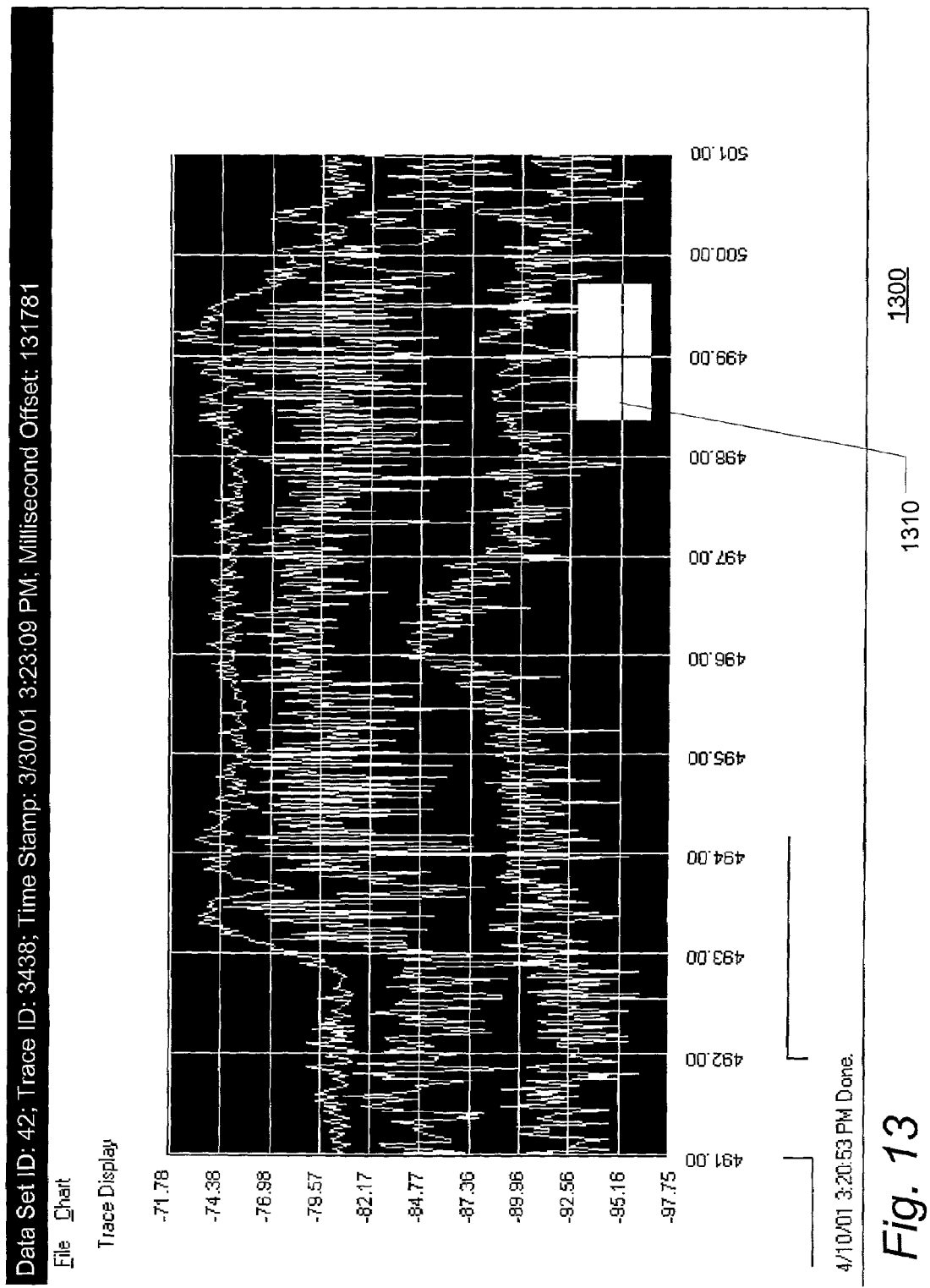
FIG. 13 shows a preferred display screen for displaying a graphical representation of data stored in an existing data set and two sets of functional combinations corresponding to the same data set.

In the example shown in FIG. 12, three boxes have been checked: the one labeled "Trace" (for data sets 230 to be displayed one trace at a time), the one labeled "Max Hold" (for displaying the maximum amplitude measured at each frequency included in the configuration 200), and the one labeled "Min Hold" (for displaying the minimum amplitude measured at each frequency included in the configuration 200). FIG. 13 shows a preferred display screen 1300 or "window" for displaying a graphical representation of data stored in an existing data set 230 and two sets of functional combinations corresponding to the same data set 230. More particularly, the graphs in FIG. 13 represent, respectively, a single trace from a data set 230 corresponding to a configuration 200 set up to scan frequencies from 491.00 kHz to 501.00 kHz, the maximum hold for the same data set 230 as a whole, and the minimum hold for the same data set 230 as a whole.

Basic statistical attributes such as maximum hold, average, and minimum hold are commonly available on most spectrum analyzers. However, neither the special statistical tools (maximum hold−average), (average−minimum hold), and (maximum+minimum−2×average) nor trace histograms are available. These functions were incorporated into the software 100 as tools for the EMI investigator. Moreover, the investigator is free to use these tools on any data set 230 even after an investigation has already been conducted. Calculation of these special functional combinations may be particularly advantageous in certain situations. For example, if an EMI event with high amplitude occurs only once during a test run 220, the (maximum hold−average) will highlight that event. The same holds true for an infrequently occurring minimum in that the (average−minimum hold) will highlight that event. The (maximum+minimum−2×average) function will display both infrequent maxima and infrequent minima events that would otherwise be smoothed out during an averaging process.

Preferably, the user interface 500 also computes and displays histograms for the data sets 230 to aid an investigator in determining when and how often an electromagnetic event occurs. A user may choose to generate a histogram of values that exceed a limit line or that are under a limit line. The progression of the histogram may also be reviewed by scrolling through the histogram traces. In a preferred GUI, the user may select which of these histograms are to be displayed on the computer 50 in the display state 525 by checking the corresponding box to the left of the histogram's name in a "Histogram Traces" area of the display screen 1200 corresponding to the traces display screen 1200, as illustrated in FIG. 12. The limit line itself may likewise be displayed by checking its corresponding box. All of the histogram data may be generated by clicking an adjacent "Calculate" button. In addition, the number of traces having an amplitude that exceeds the limit line, the number of traces having an amplitude under the limit line, and the value of the limit line itself (preferably expressed in dBm) are displayed in the same area. Means may also be provided to permit the user to adjust the limit line up and down, and for a limit line to be calculated automatically on the basis of some predetermined criteria.

Preferably, all of the graphical representations described in the previous paragraphs may be generated, updated and displayed a single trace at a time. When displaying individual traces (by selecting the "Trace" graph in the preferred display screen 1200), this results in the traces in the data set 230 being displayed one at a time in sequential order. For functional combinations, this may result in a series of graphs of the selected type being displayed on the computer 50, with each successive graph representing the result of the next sequential trace being incorporated into the functional combination or histogram displayed in the previous graph. Preferably, the user may select whether the graphs are stepped through automatically or only upon the command of the user. If automatic progression is selected, the user may be able to control how quickly the computer 50 moves from one graph to the next.

Figure 14:
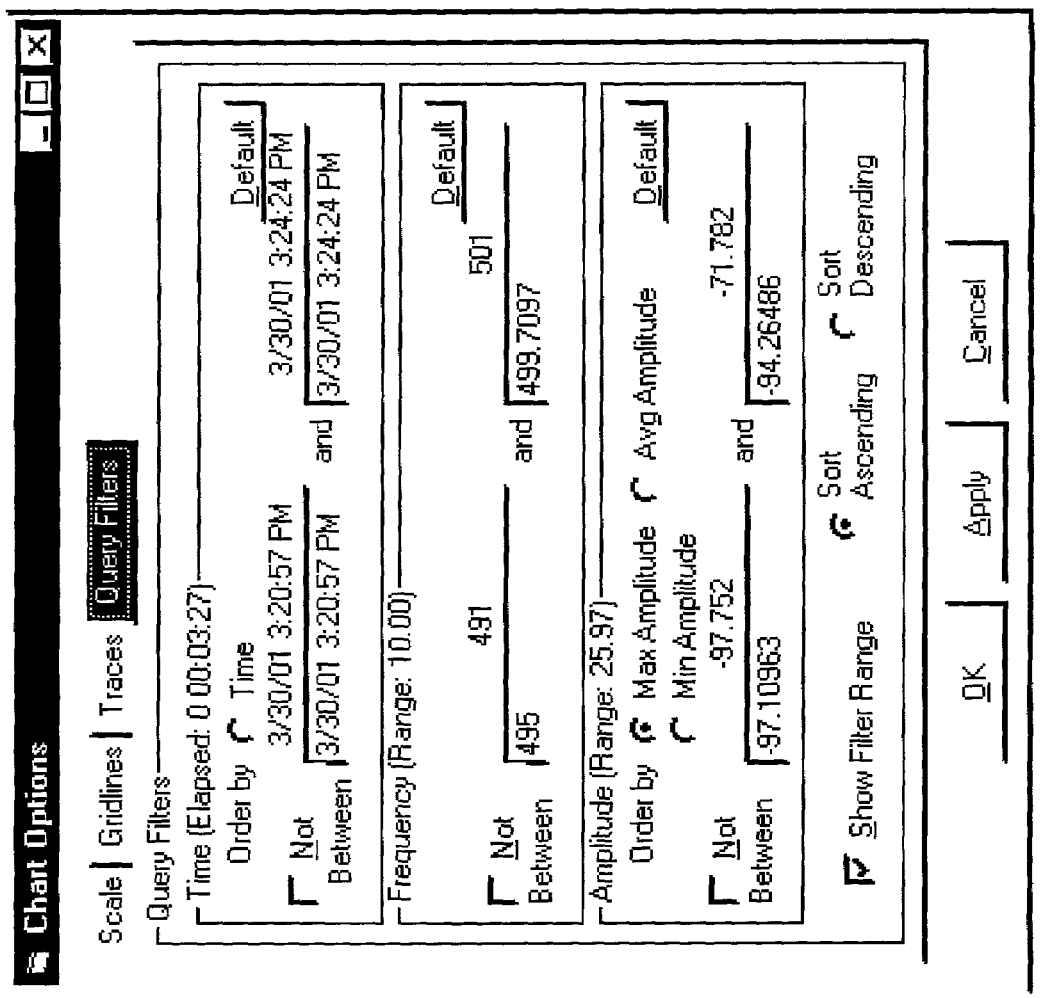
FIG. 14 shows a preferred display screen corresponding to a "Query Filters" tab in the modify display options state of the user interface.

If the user chooses to filter out some of the data points on the basis of certain criteria, then the user interface 500 proceeds to display a set of scale options to the user. FIG. 14 shows a preferred display screen 1400 or "window" corresponding to the "Query Filters" tab in the modify display options state 530 of the user interface 500. The user interface 500 preferably gives the user the ability to specify criteria according to time, amplitude, and frequency to "sniff out" important aspects (components) of any data set 230. For example, a user may only be interested in events that were captured within a specific date, time frame or within a specific frequency range. This may be accomplished by defining a query that specifies a particular time range, frequency range, or amplitude range. The total range of values for each criteria may be displayed by clicking the "Show Filter Range" box. The user may also select an inverse search criteria for any of the three criteria by checking the appropriate "Not Between" box. The user interface 500 preferably also gives the user the ability to order the traces by time, by maximum amplitude, by minimum amplitude, or by average amplitude. These criteria may be arranged in either ascending or descending order, as selected by the user. Also, any adjustments to the data via the filters may be removed by clicking the "Default" button corresponding to the criteria. Finally, after selecting and applying the desired filter options, the user may choose to adjust or control other display options, as available in the display options state 530, or to return to the display state 525.

While in the display state 525, the user may choose to focus on a specific rectangular- or square-shaped area contained within the display area. An area may be selected by placing the cursor over the area of interest and drawing a box 1310 around the components (events) of interest. Once the area is selected, a query is performed on that area, wherein the query result is the components in the data set 230 that are included within that area.

Returning to the test execution state 520, the investigator may also choose to generate random data. Although the generation of random data is not generally useful for characterizing or predicting electromagnetic environments, it is useful to those interested in learning how to setup, configure, and operate the apparatus 10, and to use the system data analysis tools. It may also be necessary to generate random data points for some types of EMI analysis. In a preferred GUI, random data may be generated by selecting the appropriate option in a "Data Source Options" area of the display screen 800. With the feature enabled, only the attributes under the data destination options and the data viewing options windows are enabled.

As is evident from the above discussion, the system of the present invention can be used to proactively or reactively identify the characteristics of radiated electromagnetic fields in many different facilities 300, including healthcare facilities and other commercial and industrial facilities. The location or locations 310 where measurements are taken will depend upon the nature of the customers' business, the type of end-use equipment used in a specific area, and the nature of the EMI problem. The duration of a scan at a location 310 will also depend upon the nature of the customers' business, the nature of the EMI problem, how many frequency ranges are to be scanned, and the total time allowed on site. A test run duration of half-a-day to two days per location 310 is not unreasonable for characterizations. If an EMI problem is being investigated, longer duration may be required.

For certain types of facilities 310, such as healthcare facilities, the EMI investigator must be particularly careful as to how the apparatus is applied because of the nature of the facility 310 and the activities carried out there. For example, a healthcare facility must continuously provide care services to patients. Generally, the investigator should first meet with the facility manager and discuss the proposed test plan before measurements are taken. The plan should be revised based on efforts to minimize interruption to the customers' business. In addition, the investigator may be accompanied by a member of the staff at the facility during the system setup process. Proper signage may be placed on the hardware 10 indicating that critical environmental measurements are being taken and that the equipment should not be disturbed during the measurement process.

As described previously, FIG. 3 depicts a representative floor plan of a typical facility in which the present invention may be utilized. The floor plan contains fifteen cross-hatch marks indicating locations 310 where the system of the present invention may be used to characterize the electromagnetic environment. Generally, spectra at several frequency spans or ranges should be taken. Although the EMI investigator may choose his or her own frequency spans, eight suggested spans are listed below. A 10 kHz overlap between spans may help to ensure data at the start and stop frequencies are captured.

10 kHz to 110 kHz
100 kHz to 1.010 MHz
1 MHz to 5.010 MHz
5 MHz to 10.010 MHz
10 MHz to 50.010 MHz
50 MHz to 100.010 MHz
100 MHz to 500.010 MHz
500 MHz to 1 GHz

If the EMI investigator desires to use the system reactively as an instrument to locate an interference source, it may be used in the automatic or manual mode. In the manual mode, the investigator will have access to the spectrum analyzer 30 and will be able to print spectra as needed. However, for more complex problems, such as trying to determine what may be causing a particular medical device to malfunction, the investigator would want to setup the system through the computer 50 to capture a series of spectra. The investigator will also want to notify the medical device operator to log the date, time, and equipment conditions of any device malfunctions that occur so that the investigator can review the spectral data to learn more about the characteristics of the interference source.

Based on the foregoing information, it is readily understood by those persons skilled in the art that the present invention is susceptible of broad utility and application. Many embodiments and adaptations of the present invention other than those specifically described herein, as well as many variations, modifications, and equivalent arrangements, will be apparent from or reasonably suggested by the present invention and the foregoing descriptions thereof, without departing from the substance or scope of the present invention. Accordingly, while the present invention has been described herein in detail in relation to its preferred embodiment, it is to be understood that this disclosure is only illustrative and exemplary of the present invention and is made merely for the purpose of providing a full and enabling disclosure of the invention. The foregoing disclosure is not intended to be construed to limit the present invention or otherwise exclude any such other embodiments, adaptations, variations, modifications or equivalent arrangements; the present invention being limited only by the claims appended hereto and the equivalents thereof. Although specific terms are employed herein, they are used in a generic and descriptive sense only and not for the purpose of limitation.

What is claimed is:

1. A method of analyzing electromagnetic interference in a building, comprising the steps of:
   defining a plurality of configurations, each configuration corresponding to a plurality of frequencies in a frequency range, the plurality of configurations including at least a first configuration corresponding to a plurality of frequencies in a first frequency range and a second configuration corresponding to a plurality of frequencies in a second frequency range, the first and second frequency ranges being discontinuous from each other;
   stationing a spectrum analyzer in a location in the building;
   instructing the spectrum analyzer to scan the frequencies in each configuration;
   leaving the spectrum analyzer unattended while it scans the frequencies in each configuration, wherein for each configuration, the spectrum analyzer scans the frequecies in the configuration by measuring the amplitude of electromagnetic energy it receives at each frequency in the configuration, and wherein a trace is generated each time the spectrum analyzer completes a single scan of all the frequencies in the configuration;
   storing at least some of the amplitude measurements from each trace in computer memory; and
   leaving the spectrum analyzer unattended while it adjusts from scanning the first plurality of frequencies in the first configuration to scanning the first plurality of frequencies in the second configuration.

2. The method of claim 1, wherein the step of defining a plurality of configurations occurs before the step of stationing the spectrum analyzer in the building.

3. The method of claim 1, wherein the step of defining configurations includes defining parameters in addition to the frequencies in the respective frequency ranges, wherein instructing the spectrum analyzer to scan the frequencies in each configuration includes instructing the spectrum analyzer to scan according to the defined parameters.

4. The method of claim 3, wherein the parameters include an amplitude reference level.

5. The method of claim 3, wherein the parameters include a resolution bandwidth.

6. The method of claim 3, wherein the parameters include a sweep time.

7. The method of claim 3, wherein the parameters include a scan duration.

8. The method of claim 1, further comprising the step of selecting, from the plurality of configurations, a subset of configurations for scanning by the spectrum analyzer, wherein the step of instructing the spectrum analyzer includes instructing the spectrum analyzer to scan only the selected configurations.

9. The method of claim 8, wherein the step of selecting is carried out before stationing step.

10. The method of claim 8, wherein the step of selecting is carried out after stationing step.

11. The method of claim 1, wherein the step of defining a plurality of configurations includes defining configurations having overlapping frequency ranges.

12. The method of claim 1, wherein the step of leaving the spectrum analyzer unattended includes departing the building.

13. The method of claim 1, wherein the step of defining a plurality of configurations is carried out using a computer, and wherein the step of instructing the spectrum analyzer is executed by the computer.

14. The method of claim 13, wherein the step of defining a plurality of configurations includes the steps of:
   using the spectrum analyzer to input parameters for at least one configuration; and
   importing the configuration parameters to the computer from the spectrum analyzer.

15. The method of claim 1, further comprising the step of selecting, after the spectrum analyzer finishes scanning, at least some of the data gathered by the spectrum analyzer during the scanning process for further analysis.

16. A method of using a spectrum analyzer to analyze electromagnetic interference in a building, comprising the steps of:
   storing a plurality of configurations, each configuration corresponding to a plurality of frequencies in a frequency range;
   accepting, from a user, input representing a command to scan the frequencies in each configuration;
   as a result of receiving the command input, controlling a spectrum analyzer to scan the frequencies in each configuration without further intervention from the user, wherein for each configuration, the spectrum analyzer scans the frequencies in the configuration by measuring the amplitude of electromagnetic energy it receives at each frequency in the configuration, and wherein a trace is generated each time the spectrum analyzer completes a single scan of all the frequencies in the configuration;
   storing at least some of the amplitude measurements from each trace in computer memory; and
   leaving the spectrum analyzer unattended while it transitions from scanning the plurality of frequencies in a first of the plurality of configurations to scanning the plurality of frequencies in a second configuration.

17. The method of claim 16, further comprising the step of accepting, from a user, input identifying a subset of the stored configurations, wherein the step of accepting input representing a command to scan includes accepting input representing a command to scan the frequencies in each configuration in the subset, and wherein the step of scanning the frequencies includes scanning only the frequencies in the configurations in the subset.

18. The method of claim 17, wherein the step of accepting input identifying a subset occurs before the step of accepting input representing a command to scan.

19. The method of claim 17, wherein the step of scanning the frequencies includes repeatedly sequencing through the respective configurations such that the frequencies in each configuration are scanned a predetermined number of times before the frequencies in the next sequential configuration are scanned.

20. The method of claim 19, wherein the predetermined number is one.

21. The method of claim 16, further comprising the step of storing data corresponding to each frequency scanned.

22. The method of claim 21, wherein the step of storing data includes storing a separate data set for each configuration.

23. The method of claim 16, wherein the frequencies are scanned for a predetermined period of time.

24. The method of claim 15, further comprising the step of accepting, after the spectrum analyzer finishes scanning, input from a user selecting at least some of the data gathered by the spectrum analyzer during the scanning process for further analysis.

25. A method of analyzing the electromagnetic interference, comprising the steps of:
   pre-defining a plurality of configurations, each configuration corresponding to a plurality of frequencies in a frequency range;
   pre-defining a plurality of tests, each test including at least one of the pre-defined configurations;
   selecting, from the plurality of pre-defined tests, one of the pre-defined tests for execution;
   specifying execution parameters for the selected test, the selected test and parameters together defining a test run; and
   using a spectrum analyzer, executing the test run by scanning the frequencies in the frequency range in each respective configuration in the selected test, according to the test run's specified execution parameters, without requiring user intervention to cause the spectrum analyzer to transition from scanning the frequencies in a first frequency range to scanning the frequencies in a second frequency range.

26. The method of claim 25, wherein the test run is one of a plurality of test runs.

27. The method of claim 26, wherein more than one test run specifies the same test.

28. The method of claim 25, wherein at least one of the configurations is defined at a first location, and wherein the step of scanning occurs at a second location.

29. The method of claim 25, wherein at least one of the tests is defined at a first location, and wherein the step of scanning occurs at a second location.

30. The method of claim 25, further comprising the step of selecting, after the spectrum analyzer finishes scanning, at least some of the data gathered by the spectrum analyzer during the scanning process for further analysis.

31. In a computer system having a graphical user interface including a display and a user interface selection device, a method for obtaining input from a user to control the analysis of electromagnetic interference, the method comprising the steps of:
   soliciting, from a user, input indicative of at least one specific set of frequencies;
   receiving, from the user, input indicative of at least one specific set of frequencies, each set of frequencies defining a new configuration to be used later in a scanning step;
   after receiving the input indicative of at least one newly-defined configuration, storing each configuration, including the set of frequencies which define it, in a memory;
   soliciting, from the user, input indicative of a name to be applied to each newly-defined configuration;
   receiving, from the user, input indicative of a name to be applied to each newly-defined configuration;
   after receiving the input indicative of a name for each newly-defined configuration, storing the name in the memory in association with the set of frequencies which define it;
   after defining at least one configuration and storing the at least one configuration's set of frequencies and name, displaying a list of defined configurations to the user via the display;
   receiving, from the user, selection input indicative of the name of each of the configurations that is to be scanned by a spectrum analyzer;
   based on the selection input received from the user, scanning the specific set of frequencies in each of the configurations selected by the user, wherein for each configuration, the spectrum analyzer scans the frequencies in the configurations by measuring the amplitude of electromagnetic energy it receives at each frequency in the configuration, and wherein a trace is generated each time the spectrum analyzer completes a single scan of all the frequencies in the configuration; and
   storing at least some of the amplitude measurements from each trace in the memory.

32. The method of claim 31, wherein the step of receiving selection input includes:
   soliciting, from a user, input indicative of a name for each of at least one test;
   receiving, from the user, selection input indicative of the configurations to be included in each of at least a plurality of tests; and
   after receiving the input indicative of the configurations to be included in each of at least a plurality of tests, storing data identifying such configurations in the memory in association with the name of the test in which the configurations are to be included.

33. The method of claim 31, further comprising the step of accepting, after the spectrum analyzer finishes scanning, input from a user selecting at least some of the data gathered by the spectrum analyzer during the scanning process for further analysis.

34. A method of analyzing electromagnetic interference, the method comprising the steps of:
   storing parameters for each of a plurality of configurations, each configuration corresponding to a plurality of frequencies in a frequency range, the parameters including a unique configuration identifier;
   creating a plurality of data sets, wherein a single configuration is associated with each data set;
   after storing the parameters for each of the plurality of configurations, including the unique configuration indentifier for each of the plurality of configurations, scanning the frequencies in a configuration for electromagnetic energy;
   as a result of the scanning step, storing data corresponding to at least some of the frequencies in one of the data sets, the data including individual amplitude measurements, each measurement being made at a respective one of the at least some frequencies in the configuration being scanned;
   displaying a list of data sets; and
   for each data set in the list of data sets, displaying the unique configuration identifier for the configuration associated with the respective data set.

35. The method of claim 34, wherein the same configuration may be stored with more than one data set, and wherein the same unique configuration identifier may be displayed for more than one data set in the list of data sets.

36. The method of claim 34, further comprising the step of storing each data set in a separate file having a file name distinct from the unique configuration identifier for the configuration associated with the respective data set.

37. A method of analyzing electromagnetic interference for a predetermined period of time, comprising the steps of:
   scanning a first set of frequencies with an analyzer;
   recording, in a memory, data generated by the analyzer and corresponding to the first set of frequencies;
   after scanning the first set of frequencies, scanning a second set of frequencies with the analyzer;

recording, in a memory, data generated by the analyzer and corresponding to the second set of frequencies; and repeating both scanning and both recording steps until the predetermined period of time has elapsed;

wherein repeating the scanning and recording steps includes alternating between scanning the first set of frequencies and scanning the second set of frequencies.

38. The method of claim 37, further comprising the step of accepting, from a user, input establishing the magnitude of the predetermined period of time.

39. The method of claim 37, wherein the step of scanning the first set of frequencies includes scanning each frequency in the set a predetermined number of times.

40. The method of claim 39, wherein the predetermined number is one.

41. The method of claim 37, wherein once the first scanning step is begun, both scanning steps and both recording steps are completed even if more than the predetermined period of time is required.

42. A method of analyzing electromagnetic interference in a building, comprising the steps of:

defining a set of frequencies to be scanned by a spectrum analyzer;

controlling the spectrum analyzer to measure the amplitude of electromagnetic energy at each frequency in the set of frequencies;

repeating the controlling step a plurality of times, wherein each complete set of amplitudes measured by the spectrum analyzer defines a trace; and generating one or more statistical compilations of the traces created during the controlling steps, the statistical compilations including at least one function combination of the traces wherein the functional combination is selected from the group consisting of the difference between the maximum and average amplitudes of electromagnetic energy at the respective frequencies in the plurality of traces, the difference between the average and minimum amplitudes of electromagnetic energy at the respective frequencies in the plurality of traces, and the difference between the sum of the maximum and minimum amplitudes of electromagnetic energy at the respective frequencies in the plurality of traces and twice the average amplitude of electromagnetic energy at the respective frequencies in the plurality of traces.

43. The method of claim 42, further comprising the step of graphically displaying the functional combination of the traces.

* * * * *